US012777648B2

(12) United States Patent
Nishimura et al.

(10) Patent No.: US 12,777,648 B2
(45) Date of Patent: Oct. 27, 2026

(54) MEMORY DEVICE

(71) Applicant: Kioxia Corporation, Tokyo (JP)

(72) Inventors: Takahito Nishimura, Kuwana (JP); Yugo Masuda, Yokkaichi (JP); Shota Uratani, Nishinomiya (JP)

(73) Assignee: Kioxia Corporation, Tokyo (JP)

( * ) Notice: Subject to any disclaimer, the term of this patent is extended or adjusted under 35 U.S.C. 154(b) by 303 days.

(21) Appl. No.: 18/588,295

(22) Filed: Feb. 27, 2024

(65) Prior Publication Data

US 2024/0292621 A1 Aug. 29, 2024

(30) Foreign Application Priority Data

Feb. 27, 2023 (JP) ................................ 2023-028737

(51) Int. Cl.
*H10B 43/27* (2023.01)
*H10B 43/35* (2023.01)

(52) U.S. Cl.
CPC ............. *H10B 43/27* (2023.02); *H10B 43/35* (2023.02)

(58) Field of Classification Search
CPC ................................ H10B 43/27; H10B 43/35
USPC .......................................................... 257/324
See application file for complete search history.

(56) References Cited

U.S. PATENT DOCUMENTS

2015/0194435 A1* 7/2015 Lee ........................ H10B 43/50 257/329
2021/0125919 A1* 4/2021 Machkaoutsan ....... H10B 43/10
2021/0399049 A1* 12/2021 Iizuka ................ G11C 13/0069

* cited by examiner

*Primary Examiner* — Igwe U Anya
(74) *Attorney, Agent, or Firm* — Oblon, McClelland, Maier & Neustadt, L.L.P.

(57) ABSTRACT

A memory device according to an embodiment includes a memory device including first and second plate-shaped members, columnar members, and word lines. The plurality of columnar members are arranged in a matrix of K rows (K is an integer equal to or greater than 4) between the first and second plate-shaped members. The columnar members include memory pillars and dummy pillars. The memory pillars are arranged in multiple rows between a first row and a K-th row of the K rows. The dummy pillars are arranged in the first row and the K-th row of the K rows. A diameter of each of the dummy pillars is smaller than a diameter of each of the memory pillars at a position where a word line, among the word lines, facing both the memory pillars and the dummy pillars is included.

20 Claims, 31 Drawing Sheets

MEMORY DEVICE

CROSS-REFERENCE TO RELATED APPLICATION(S)

This application is based upon and claims the benefit of priority from Japanese Patent Application No. 2023-028737, filed Feb. 27, 2023, the entire contents of which are incorporated herein by reference.

FIELD

Embodiments described herein relate generally to a memory device.

BACKGROUND

A NAND-type flash memory capable of storing data in a non-volatile manner is known.

DETAILED DESCRIPTION

Figure 1:
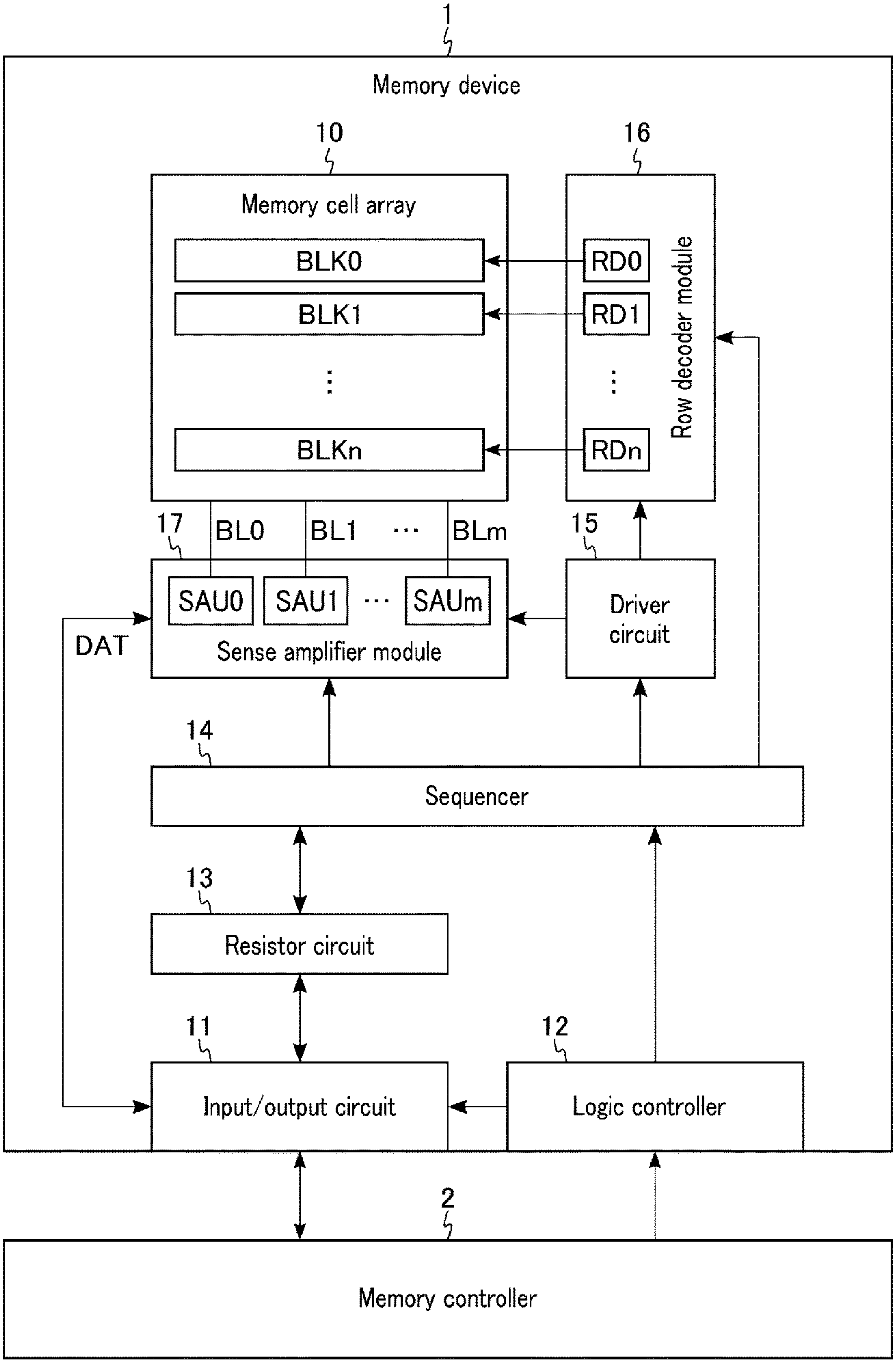
FIG. 1 is a block diagram showing an example of an overall configuration of a memory system that includes a memory device according to a first embodiment.

In general, according to one embodiment, a memory device includes a first plate-shaped member and a second plate-shaped member, a plurality of columnar members, and a plurality of word lines. The first plate-shaped member and a second plate-shaped member each have a part extending in a first direction. The first plate-shaped member and the second plate-shaped member are aligned in a second direction intersecting with the first direction. The plurality of columnar members each have a part extending in a third direction intersecting with the first direction and the second direction. The plurality of columnar members are arranged in a matrix of K rows (K is an integer equal to or greater than 4) aligned in the second direction between the first plate-shaped member and the second plate-shaped member. The plurality of columnar members include a plurality of memory pillars and a plurality of dummy pillars. The plurality of memory pillars are arranged in multiple rows between a first row and a K-th row of the K rows. The plurality of dummy pillars are arranged in the first row and the K-th row of the K rows. The plurality of word lines are provided between the first plate-shaped member and the second plate-shaped member. The plurality of word lines are spaced apart in the third direction. Each of the memory pillars includes a semiconductor layer having a part provided facing each of the word lines with respect to the second direction. Each of the plurality of dummy pillars has a part provided facing at least one of the plurality of word lines with respect to the second direction and includes a first insulating layer provided in contact with one of the first plate-shaped member or the second plate-shaped member. A diameter of each of the plurality of dummy pillars is smaller than a diameter of each of the plurality of memory pillars at a position in the third direction where a word line, among the plurality of word lines, facing both the plurality of memory pillars and the plurality of dummy pillars with respect to the second direction is included.

Hereinafter, embodiments will be described with reference to the drawings. Each of the embodiments is an example of a device and a method to embody a technical idea of the invention. The drawings are schematic or conceptual. The dimensions and scales, etc., used in the drawings are not binding on actual products. Part of each configuration may be suitably omitted. The hatching applied in the planar views does not necessarily relate to the material or characteristics of the hatched components. In the following descriptions, the elements having substantially the same function and configuration are denoted by the same numeral or sign. The reference symbols may contain a character string or the like, which is to distinguish similar components having the same reference symbols from each other.

<1> First Embodiment

A memory device 1 according to the first embodiment has a structure in which memory cells are stacked in a three-dimensional manner. In the memory device 1 according to the first embodiment, a dummy pattern for suppressing a non-opening in a pattern at a distal part is formed in a process of forming a pattern corresponding to memory cells. Details of the memory device 1 according to the first embodiment are described hereinafter.

<1-1> Configuration

First, a configuration of the memory device 1 according to the first embodiment is described.

<1-1-1> Configuration of Memory Device

FIG. 1 is a block diagram showing an example of an overall configuration of a memory system that includes the memory device 1 according to the first embodiment. As shown in FIG. 1, the memory device 1 is controlled by an external memory controller 2. The memory device 1 is a NAND-type flash memory capable of storing data in a non-volatile manner, for example. The memory device 1 includes, for example, a memory cell array 10, an input/output circuit 11, a logic controller 12, a register circuit 13, a sequencer 14, a driver circuit 15, a row decoder module 16, and a sense amplifier module 17.

The memory cell array 10 includes a plurality of blocks BLK0 to BLKn (n is an integer of 1 or more). The block BLK is a set of a plurality of memory cells. A block BLK corresponds to a unit of data erasure for example. A block BLK includes a plurality of pages. A page corresponds to a unit on which data read and write are performed. Although not shown, a plurality of bit lines BL0 to BLm ("m" is an integer equal to or greater than 1) and a plurality of word lines WL are provided in the memory cell array 10. Each memory cell is associated with, for example, one bit line BL and one word line WL.

The input/output circuit 11 is an interface circuit that governs transmission and reception of an input/output signal transmitted and received between the memory device 1 and the memory controller 2. The input/output signal may include data DAT, status information, address information, and a command. The input/output circuit 11 may input and output data DAT between the sense amplifier module 17 and the memory controller 2. The input/output circuit 11 may output status information transferred from the register circuit 13 to the memory controller 2. The input/output circuit 11 may output address information and a command transferred from the memory controller 2 to the register circuit 13.

The logic controller 12 controls the input/output circuit 11 and the sequencer 14 based on control signals that are input from the memory controller 2. For example, the logic controller 12 controls the sequencer 14 and enables the memory device 1. The logic controller 12 notifies the input/output circuit 11 that the input/output signal received by the input/output circuit 11 is a command or address information. The logic controller 12 instructs the input/output circuit 11 to input or output an input/output signal.

The register circuit 13 temporarily stores status information, address information, and a command. The status information is updated based on the control by the sequencer 14 and transferred to the input/output circuit 11. The address information includes, for example, a block address, a page address, and a column address, etc. The command includes an instruction relating to various operations of the memory device 1.

The sequencer 14 controls an operation of the entire memory device 1. For example, the sequencer 14 performs a read operation, a write operation, an erase operation, and the like based on a command and address information stored in the register circuit 13.

The driver circuit 15 generates voltages used in a read operation, a write operation, an erase operation, etc. The driver circuit 15 supplies generated voltages to the row decoder module 16 and the sense amplifier module 17.

The row decoder module 16 is a circuit used for selecting an operation-target block BLK and transfer of a voltage to an interconnect such as a word line WL. The row decoder module 16 includes a plurality of row decoders RD0 to RDn. The row decoders RD0 to RDn are associated with the blocks BLK0 to BLKn, respectively. The row decoders RD are used to select a block BLK.

The sense amplifier module 17 is a circuit used for transfer of a voltage to each bit line BL and data read. The sense amplifier module 17 includes a plurality of sense amplifier units SAU0 to SAUm. The sense amplifier units SAU0 to SAUm are associated with the bit lines BL0 to BLm, respectively. Each sense amplifier unit SAU includes a sense amplifier for determining data and a latch circuit for retaining data temporarily.

A combination of a memory device 1 and a memory controller 2 may constitute a single semiconductor apparatus. Examples of such semiconductor devices include a memory card such as an SD™ card and a solid state drive (SSD).

<1-1-2> Circuit Configuration of Memory Cell Array 10

Figure 2:
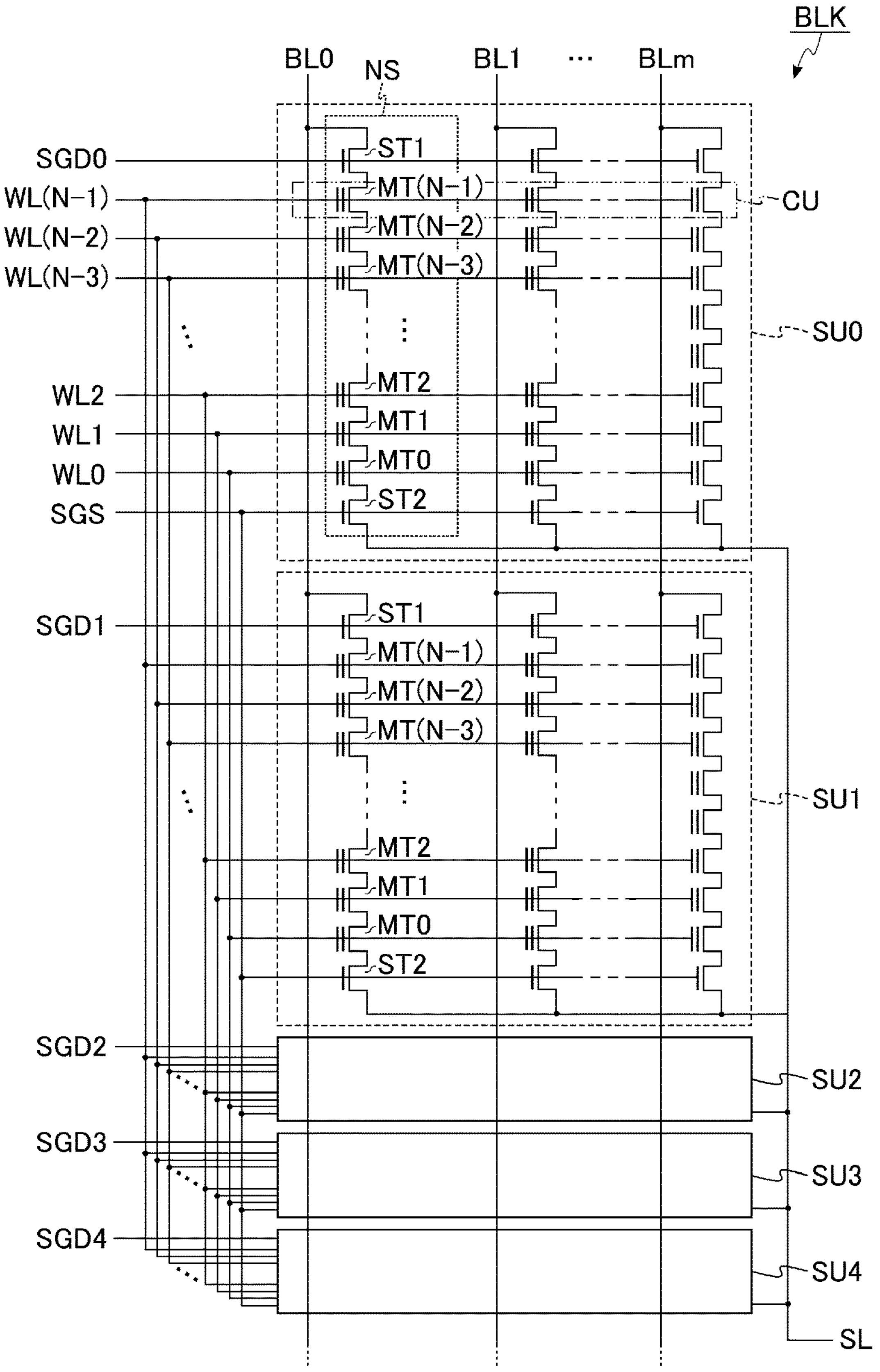
FIG. 2 is a circuit diagram showing an example of the circuit configuration of the memory cell array included in the memory device according to the first embodiment.

FIG. 2 is a block diagram showing an example of the circuit configuration of the memory cell array 10 included in the memory device 1 according to the first embodiment. FIG. 2 shows one block BLK of a plurality of blocks BLK included in the memory cell array 10. As shown in FIG. 2, the block BLK includes, for example, five string units SU0 to SU4. Select gate lines SGD0 through SGD4 and SGS and word lines WL0 through WL(N-1) (N is an integer equal or greater than 2) are provided in each block BLK. The bit lines BL0 through BLm and the source line SL is shared by a plurality of blocks BLK.

Each string unit SU includes a plurality of NAND strings NS. A plurality of NAND strings NS are respectively associated with bit lines BL0 through BLm. In other words, each bit line BL is shared by the NAND strings NS having the same column address, over the multiple blocks BLK. Each NAND string NS is coupled between a bit line BL and a source line SL associated with each other. Each NAND string NS includes, for example, N memory cell transistors MT0 to MT(N-1) and select transistors ST1 and ST2. Each memory cell transistor MT is a memory cell having a control gate and a charge storage layer, and stores data in a non-volatile manner. Each of the select transistors ST1 and ST2 is used to select a string unit SU.

In each NAND string NS, the select transistor ST1, the memory cell transistors MT(N-1) through MT0, and the select transistor ST2 are coupled in series in this order. Specifically, the drain end and the source end of the select transistor ST1 are coupled to a corresponding bit line BL and the drain end of the memory cell transistor MT(N-1), respectively. The drain end and the source end of the select transistor ST2 are coupled to the source end of the memory cell transistor MT0 and a source line SL, respectively. The memory cell transistors MT0 through MT(N-1) are coupled in series between the select transistors ST1 and ST2.

The select gate lines SGD0 through SGD4 are associated with the string units SU0 through SU4, respectively. Each select gate line SGD is coupled to the gate end of each of the select transistors ST1 included in the corresponding string unit SU. The select gate lines SGS are coupled to respective gate ends of the plurality of select transistors ST2 included in a corresponding block BLK. The word lines WL0 through WL(N-1) are respective gate ends of each of the memory cell transistors MT0 through MT(N-1) included in a corresponding block BLK.

A set of a plurality of memory cell transistors MT coupled to a common word line WL within a string unit SU may be referred to as, for example, a "cell unit CU". For example, the storage capacity of the cell unit CU in the case where each memory cell transistor MT stores 1-bit data is defined as "1-page data". The cell unit CU can have a storage capacity of 2-page data or more in accordance with the number of bits of data stored in the memory cell transistors MT.

Note that the circuit configuration of the memory cell array 10 included in the memory device 1 according to the first embodiment is not limited to the above described configuration. For example, the number of string units SU included in each block BLK and the number of each of the memory cell transistors MT and the select transistors ST1 and ST2 included in each NAND string NS may be designed to be any arbitrarily selected number. In the first embodiment, an example in which each NAND string NS includes eight memory cell transistors MT0 to MT7 respectively coupled to word lines WL0 through WL7 is described.

<1-1-3> Structure of Memory Cell Array

Hereinafter, a structure of the memory cell array 10 included in the memory device 1 according to the first embodiment is described. In the drawings referred to hereinafter, a three-dimensional orthogonal coordinate system is used. An X direction corresponds to a direction in which the word lines WL extend. A Y direction corresponds to a direction in which the bit lines BL extend. A Z direction corresponds to a direction perpendicular to the surface of a substrate used for forming the memory device 1. An XY plane (a cross section) corresponds to a plane (a cross section) defined by the X direction and the Y direction. An XZ plane (a cross section) corresponds to a plane (a cross section) defined by the X direction and the Z direction. The expression "above and below" in the present description is defined based on a direction along the Z direction, and a direction going away from a front surface side of a reference material is defined as a positive direction (an upward direction). As a reference material, a conductive layer serving as a source line SL of the memory cell array 10 is used, for example.

(1: Planar Layout of Memory Cell Array)

Figure 3:
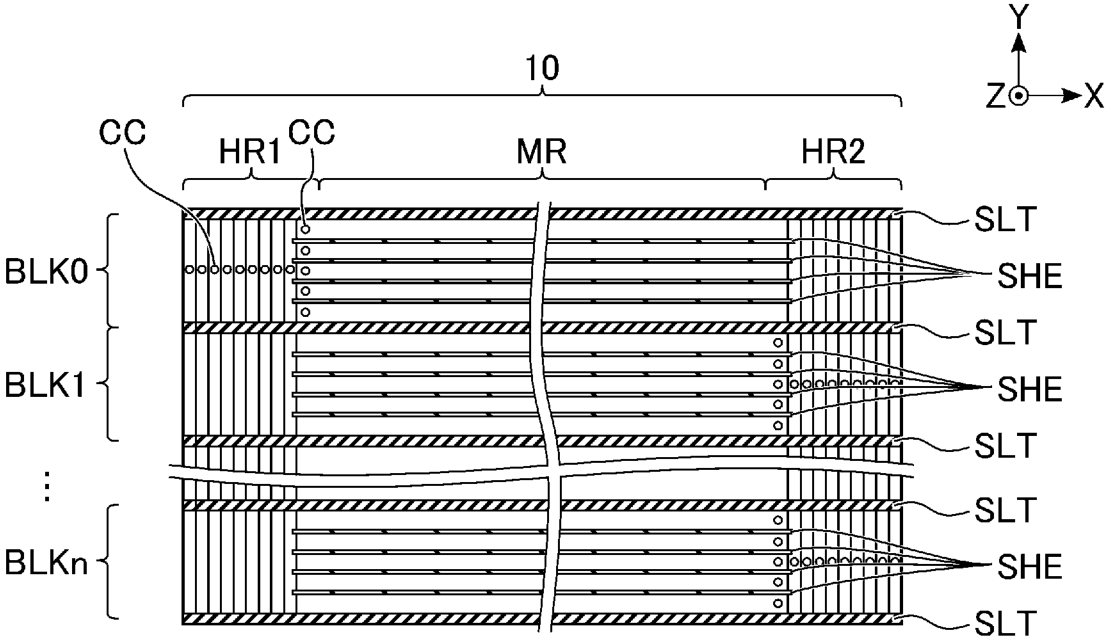
FIG. 3 is a plan view showing an example of the planar layout of a memory cell array included in the memory device according to the first embodiment.

FIG. 3 is a plan view showing an example of the planar layout of the memory cell array 10 included in the memory device according 1 to the first embodiment. As shown in FIG. 3, for example, the memory cell array 10 has a memory region MR and hookup regions HR1 and HR2. The memory region MR includes a plurality of NAND strings NS. The memory region MR is interposed between the hookup regions HR1 and HR2 in the X direction. Each of the hookup regions HR1 and HR2 is a region used for forming coupling between interconnects (e.g., the word lines WL and the select gate lines SGD and SGS) and the row decoder module 16. The memory cell array 10 includes a plurality of slits SLT, a plurality of slits SHE, and a plurality of contacts CC.

Each slit SLT has a part extending in the X direction, and cuts across the hookup region HR1, the memory region MR, and the hookup region HR2 along the X direction. The plurality of slits SLT are arranged in the Y direction. Each slit SLT divides interconnects that are adjacent to each other via the slit SLT (e.g., the word lines WL0 to WL7 and the select gate lines SGD and SGS). The part of each slit SLT extending in the X direction may be called a "plate-shaped member". In each slit SLT, a conductor provided with a conductor whose side wall is provided with a spacer made of an insulator may be arranged to be insulated from the interconnects, or each slit SLT may be embedded with an insulator. In the memory cell array 10, each of the regions sectioned along the Y direction by the slits SLT corresponds to one block BLK.

Each slit SHE has a part extending in the X direction, and cuts across the memory region MR along the X direction. The plurality of slits SHE are arranged in the Y direction. In this example, four slits SHE are arranged between any two slits SLT adjacent to each other in the Y direction. Each slit SHE has, for example, a structure into which an insulator is embedded. The slit SHE divides interconnects that are adjacent to each other via the slit SHE. It suffices that the slit SHE divides at least the select gate line SGD. In the memory cell array 10, each of the regions sectioned along the Y direction by the slits SLT and SHE corresponds to one string unit SU.

The end parts of the stacked interconnect provided in the memory cell array 10 (for example, the select gate line SGS, the word lines WL0 through WL7, and the select gate line SGD) respectively have a terrace portion in each of the hookup regions HR1 and HR2. The terrace portion corresponds to a part that does not overlap the interconnects (conductive layers) of higher layers when viewed from a top. The structure formed by a plurality of the terrace portions is similar to a step, a terrace, a rimstone, or the like. In the present example, the stepped structure having level differences in the X direction is formed by the end of the select gate line SGS, the ends of the word lines WL0 through WL7, and the end of the select gate line SGD.

The contacts CC coupled to the stacked interconnect are coupled to a terrace portion of at least one of the hookup region HR1 or HR2. For example, the stacked interconnects of the blocks BLK of even numbers (BLK0, BLK2, . . . ) are coupled to the contacts CC provided in the hookup region HR1. The stacked interconnects of the blocks BLK of odd numbers (BLK1, BLK3, . . . ) are coupled to the contacts CC provided in the hookup region HR2. The memory device 1 may have a structure in which the terrace portion of each hookup region HR is omitted. In this case, the contacts CC coupled to the conductive layer where the stacked interconnect is present are provided so as to penetrate the conductive layers of higher layers, spaced apart from each other. The hookup region HR may be arranged in such a manner that it partitions the memory region MR in the X direction.

The planar layout of the memory cell array 10 included in the memory device 1 according to the first embodiment may be a layout other than the above-described layout. For example, the number of slits SHE arranged between two adjacent slits SLT can be freely designed. The number of string units SU included in each block BLK may be changed based on the number of the slits SHE arranged between two adjacent slits SLT. The arrangement of the contacts CC coupled to the stacked interconnects may be changed as appropriate.

(2: Planar Layout in Memory Region MR)

Figure 4:
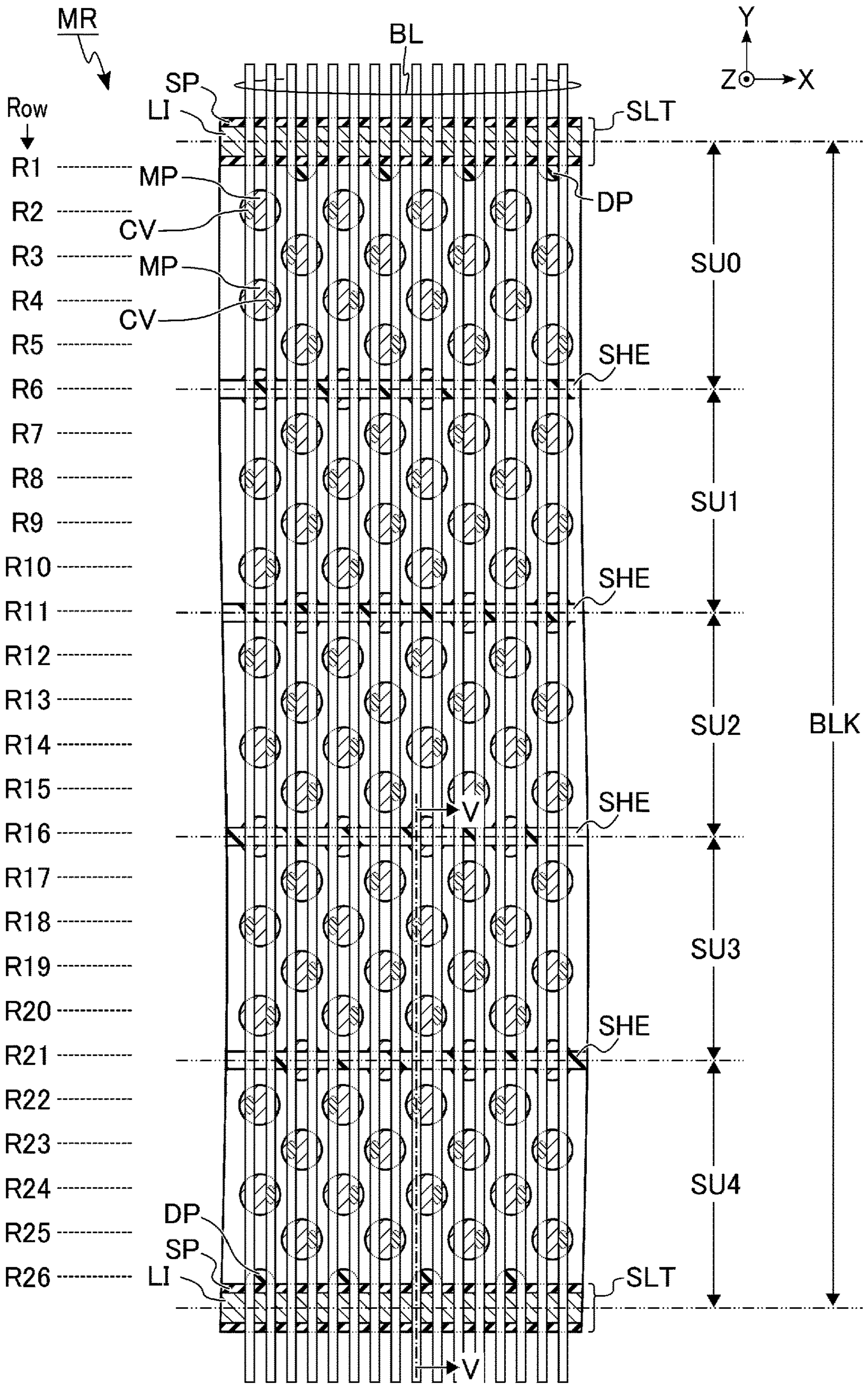
FIG. 4 is a plan view showing an example of a detailed planar layout in a memory region of the memory cell array included in the memory device according to the first embodiment.

FIG. 4 is a plan view showing an example of a detailed planar layout in the memory region MR of the memory cell array 10 included in the memory device 1 according to the first embodiment. FIG. 4 displays an area that includes a single block BLK (namely string units SU0 to SU4). As shown in FIG. 4, the memory cell array 10 in its memory region MR includes multiple memory pillars MP, multiple dummy pillars DP, multiple contacts CV, and multiple bit lines BL. Each member SLT includes a contact LI and a spacer SP.

Each memory pillar MP is, for example, a columnar member that functions as a single NAND string NS. Each dummy pillar DP is a columnar member made of an insulator. The memory pillars MP and the dummy pillars DP may be called a "columnar member". A set of multiple memory pillars MP and multiple dummy pillars DP is arranged in each block BLK. Specifically, multiple memory pillars MP and multiple dummy pillars DP in the set are arranged in, for example, a 26-row staggered arrangement (in a matrix manner) in an area between two adjacent slits SLT. In the present example, the part where the pillars are aligned in the X direction will be regarded as "rows" for the sake of explanation. Hereinafter, 26 rows of pillars arranged in a block BLK may be called "R1" through "R26", respectively. If any one of "(R1)" through "(R26)" is added at the end of a reference numeral, it means that the structure referenced by the reference numeral is arranged in the row indicated by the appendage.

Multiple dummy pillars DP are arranged in the first row R1 counting from the top of the drawing sheet in the set of memory pillars MP and dummy pillars DP arranged in a staggered manner. Each of the dummy pillars DP(R1) is in contact with the slit SLT arranged in the upper side of the drawing sheet and has a semicircle shape when viewed in a plan-view perspective. Multiple memory pillars MP are arranged in each of the second row R2 through the 25th row R25 counting from the top of the drawing sheet. For example, respective single slits SHE overlap with the memory pillar MP(R6), the memory pillar MP(R11), the memory pillar MP(R16), and the memory pillar MP(R21). Multiple dummy pillars DP are arranged in the 26th row R26 counting from the top of the drawing sheet. Each of the dummy pillars DP(R26) is in contact with the slit SLT arranged in the lower side of the drawing sheet and has a semicircle shape when viewed in a plan-view perspective. In other words, in the XY section, each dummy pillar DP has approximately a shape of a circle chipped off by any one of the slits SLT. In the present description, "semicircle shape" does not necessarily means a shape of a halved circle. Furthermore, if a virtual circle is defined, "semicircle shape" in the present description may or may not include the center of a virtual circle.

The bit lines BL, each of which includes a part that extends in the Y direction, are aligned in the X direction. Each bit line BL is arranged to overlap at least one memory pillar MP in each string unit SU. In this example, one memory pillar MP is arranged so as to overlap two bit lines BL. One bit line BL of a plurality of bit lines BL that overlap a memory pillar MP and the memory pillar MP are electrically coupled via a contact CV.

For example, a contact CV is omitted between a memory pillar MP in contact with a slit SHE and a bit line BL. In other words, a contact CV is omitted between a memory pillar MP in contact with two different select gate lines SGD and a bit line BL. Such memory pillars MP do not function as a NAND string NS that includes memory cells for storing data. The number or the layout of the memory pillars MP and the slits SHE, or other components, arranged between the neighboring slits SLT are not limited to the exemplary structure described with reference to FIG. 4 and may be appropriately changed. The number of bit lines BL that overlap each memory pillar MP can be freely designed.

The contact LI is a conductor including a part that extends in the X direction. The spacer SP is an insulator provided on a side surface of the contact LI. The contact LI is sandwiched by the spacers SP. The contact LI and a conductive layer adjacent to the contact LI in the Y direction (e.g., the word lines WL0 to WL7, and the select gate lines SGD and SGS) are distanced and insulated by the spacer SP. The spacer SP is, for example, an oxide film.

(3: Sectional Structure of Memory Cell Array 10)

Figure 5:
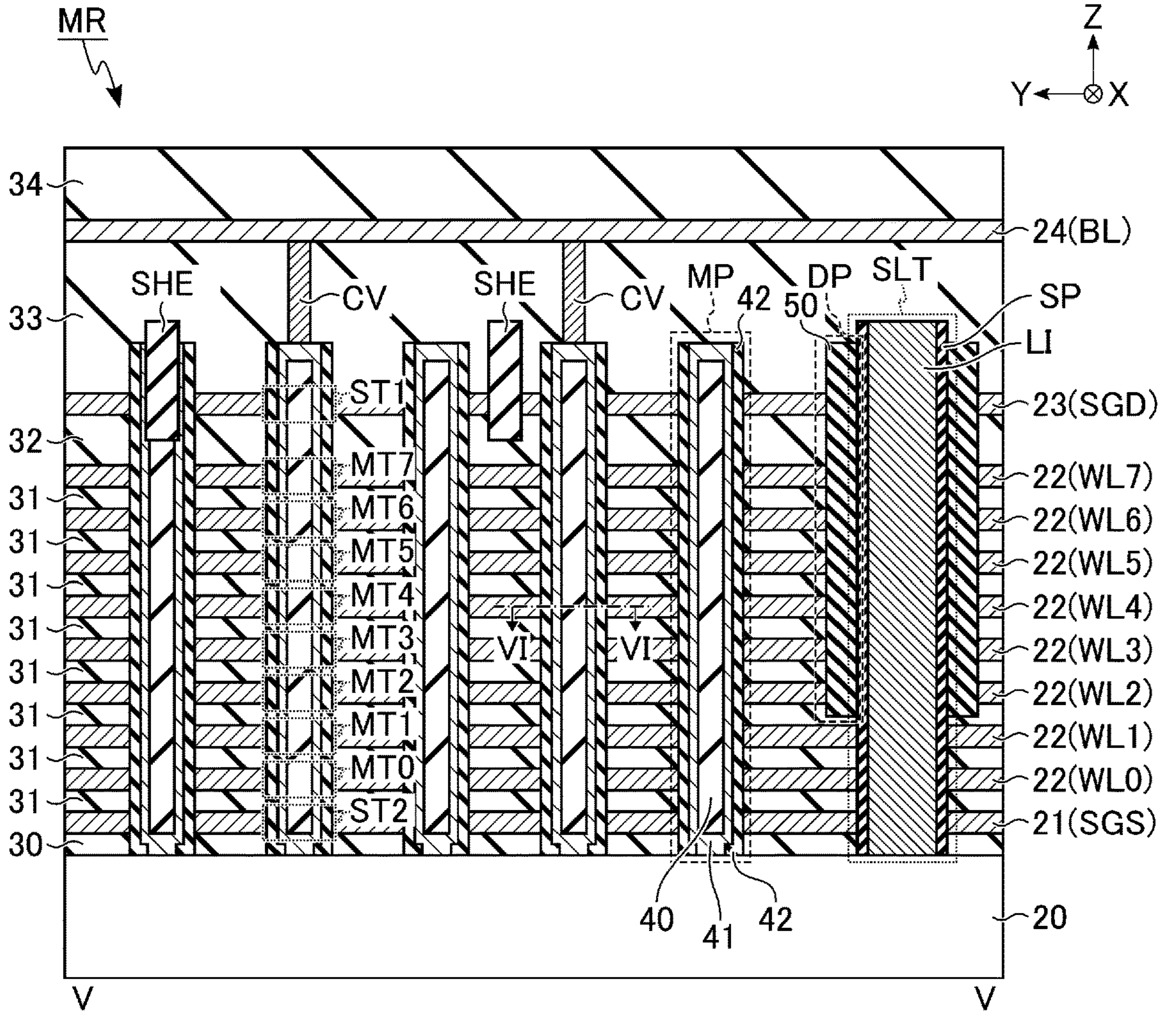
FIG. 5 is a sectional view taken along line V-V of FIG. 4, showing an example of a sectional structure of the memory cell array included in the memory device according to the first embodiment.

FIG. 5 is a sectional view taken along line V-V of FIG. 4, showing an example of a sectional structure of the memory cell array 10 included in the memory device 1 according to the first embodiment. As shown in FIG. 5, the memory device 1 of the first embodiment includes, for example, a semiconductor substrate 20, conductive layers 21 to 24, and insulating layers 30 to 34 in a memory region MR.

The semiconductor substrate 20 is, for example, a P-type silicon substrate. The semiconductor substrate 20 is used as a part of the source lines SL, for example. The semiconductor substrate 20 may be called as a "conductive layer". The insulating layer 30 is provided on the semiconductor substrate 20. The conductive layer 21 is provided on the insulating layer 30. The insulating layers 31 and the conductive layers 22 are alternately stacked on the conductive layer 21. The insulating layer 32 is provided on the uppermost conductive layer 22. The conductive layer 23 is provided on the insulating layer 32. The insulating layer 33 is provided on the conductive layer 23. The conductive layer 24 is provided on the insulating layer 33. The insulating layer 34 is provided on the conductive layer 24.

Each of the conductive layers 21 to 23 is formed in a plate-like shape along with the XY plane, for example. The conductive layer 24 is formed in a shape of a line extending in the Y direction, for example. The insulating layer 34 includes an interconnect for coupling the memory cell array 10 to the row decoder module 16. The conductive layer 21 serves as the select gate line SGS. The eight stacked conductive layers 22 are used as word lines WL0 to WL7 in the named order from the conductive layer 21 side. The conductive layer 23 serves as the select gate line SGD. The conductive layer 24 is used as bit lines BL. The conductive layers 21 to 23 contain, for example, tungsten. The conductive layer 24 contains, for example, copper.

The memory pillars MP are provided in such a manner that they extend along the Z axis. The memory pillars MP penetrate the insulating layers 30 to 32 and the conductive layers 21 to 23. Accordingly, the memory pillars MP intersect with the conductive layers 21 to 23. In other words, each of the memory pillars MP has a part facing the insulating layers 30 to 32, the select gate line SGS, the word lines WL0 to WL7, and the select gate line SGD, with respect to the Y direction. The bottoms of the memory pillars MP are in contact with the semiconductor substrate 20. A part where the memory pillar MP and the conductive layer 21 intersect each other functions as the select transistor ST2. A part at which the memory pillar MP and one conductive layer 22 intersect each other functions as a memory cell transistor MT. A part where the memory pillar MP and the conductive layer 23 intersect each other functions as the select transistor ST1.

Each memory pillar MP includes, for example, a core member 40, a semiconductor layer 41, and a stacked film 42. The core member 40 is provided so as to extend along the Z direction. The semiconductor layer 41 surrounds the core member 40. The bottom of the semiconductor layer 41 is in contact with the semiconductor substrate 20. The stacked film 42 covers the side surface and the bottom surface of the semiconductor layer 41, except for the parts at which the semiconductor layer 41 and the semiconductor substrate 20 are in contact with each other. The core member 40 includes an insulator, such as silicon oxide. The semiconductor layer 41 includes silicon, for example.

The contact CV is provided in a columnar shape extending along the Z direction. Each contact CV is provided on the semiconductor layer 41 of the memory pillar MP. In the illustrated area, two contacts CV, respectively corresponding to two of the five memory pillars MP, are shown. A single conductive layer 24 is in contact with the upper surface of the contact CV. The memory pillar MP arranged between any adjacent slits SLT and SHE and the memory pillar MP arranged between any two adjacent slits SHE are electrically coupled to each conductive layer 24.

The slit SLT includes, for example, a part provided along the XZ plane, and divides the conductive layers 21 to 23 and the insulating layers 30 to 32. In the slit SLT, the contact LI is provided along the slit SLT. The upper end of the contact LI is provided at a level higher than the upper end of the memory pillar MP and lower than the conductive layer 24. The lower end of the contact LI is in contact with the semiconductor substrate 20. The semiconductor substrate 20 may have an impurity diffusion region in a part where the semiconductor substrate 20 is in contact with the contact LI. The contact LI is used as another part of the source lines SL. The spacer SP distances and insulates between the contact LI and the conductive layers 21 to 23.

The slit SHE includes, for example, a part provided along the XZ plane, and divides at least the conductive layer 23. The upper end of the slit SHE is provided at a level higher than the upper end of the memory pillar MP and lower than the conductive layer 24. The lower end of the slit SHE is provided at the level of the insulating layer 32. The slit SHE includes an insulator, such as silicon oxide.

The dummy pillar DP is provided so as to extend along the Z direction. The dummy pillar DP has, for example, a part facing the conductive layer 23, at least one conductive layer 22 of the plurality of conductive layers 22, and the slit SLT, with respect to the Y direction. In this example, the dummy pillar DP has a part facing the select gate line SGD and the word lines WL2 through WL7 with respect to the Y direction. The bottom of the dummy pillar DP is in contact with the insulating layer 31 between the word line WL1 and WL2. It suffices that the bottom of the dummy pillar DP does not reach at least the semiconductor substrate 20. The dummy pillar DP includes, for example, the insulating layer 50. The insulating layer 50 is provided so as to extend in the Z direction and is in contact with the conductive layers 22 and 23 through which the insulating layer 50 penetrates and the side surface of the slit SLT.

(4: Sectional Structure of Memory Pillar MP)

Figure 6:
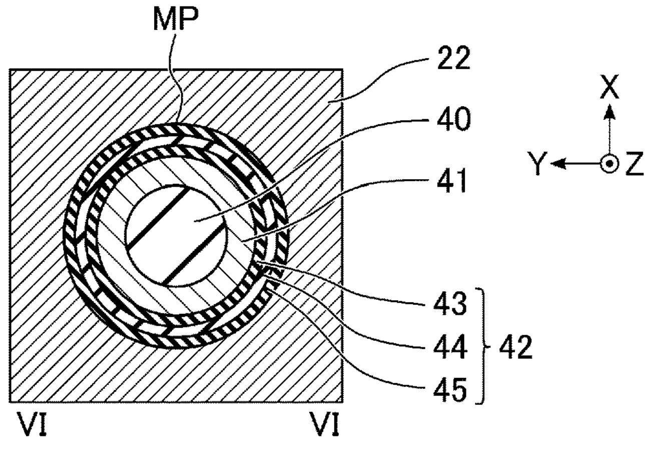
FIG. 6 is a sectional view showing an example of the sectional structure of a memory pillar included in the memory device according to the first embodiment, which is taken along line VI-VI in FIG. 5.

FIG. 6 is a sectional view showing an example of the sectional structure of the memory pillar MP included in the memory device 1 according to the first embodiment, which is taken along line VI-VI in FIG. 5. FIG. 6 shows a sectional structure of the memory pillar MP in a layer that is parallel to the surface of the semiconductor substrate 20 and that includes the conductive layer 22. As shown in FIG. 6, the stacked film 42 includes, for example, a tunnel insulating film 43, an insulating film 44, and a block insulating film 45.

In the section including the conductive layer 22, the core member 40 is provided in the center of the memory pillar MP. The semiconductor layer 41 surrounds the side surface of the core member 40. The tunnel insulating film 43 surrounds the side surface of the semiconductor layer 41. The insulating film 44 surrounds the side surface of the tunnel insulating film 43. The block insulating film 45 surrounds the side surface of the insulating film 44. A conductive layer 22 surrounds the side surface of the block insulating film 45. Each of the tunnel insulating film 43 and the block insulating film 45 contains, for example, silicon oxide. The insulating film 44 contains, for example, silicon nitride.

In the above-described memory pillar MP, the semiconductor layer 41 is used as a channel (current path) for the memory cell transistors MT0 to MT7 and the select transistors ST1 and ST2. The insulating film 44 is used as a charge storage layer of the memory cell transistors MT. The memory device 1 can cause a current to flow between the bit line BL and the contact LI (source line SL) via the memory pillar MP by turning on the memory cell transistors MT0 to MT7 and the select transistors ST1 and ST2.

(5: Detailed Layout of Vicinity of Slit SLT)

Figure 7:
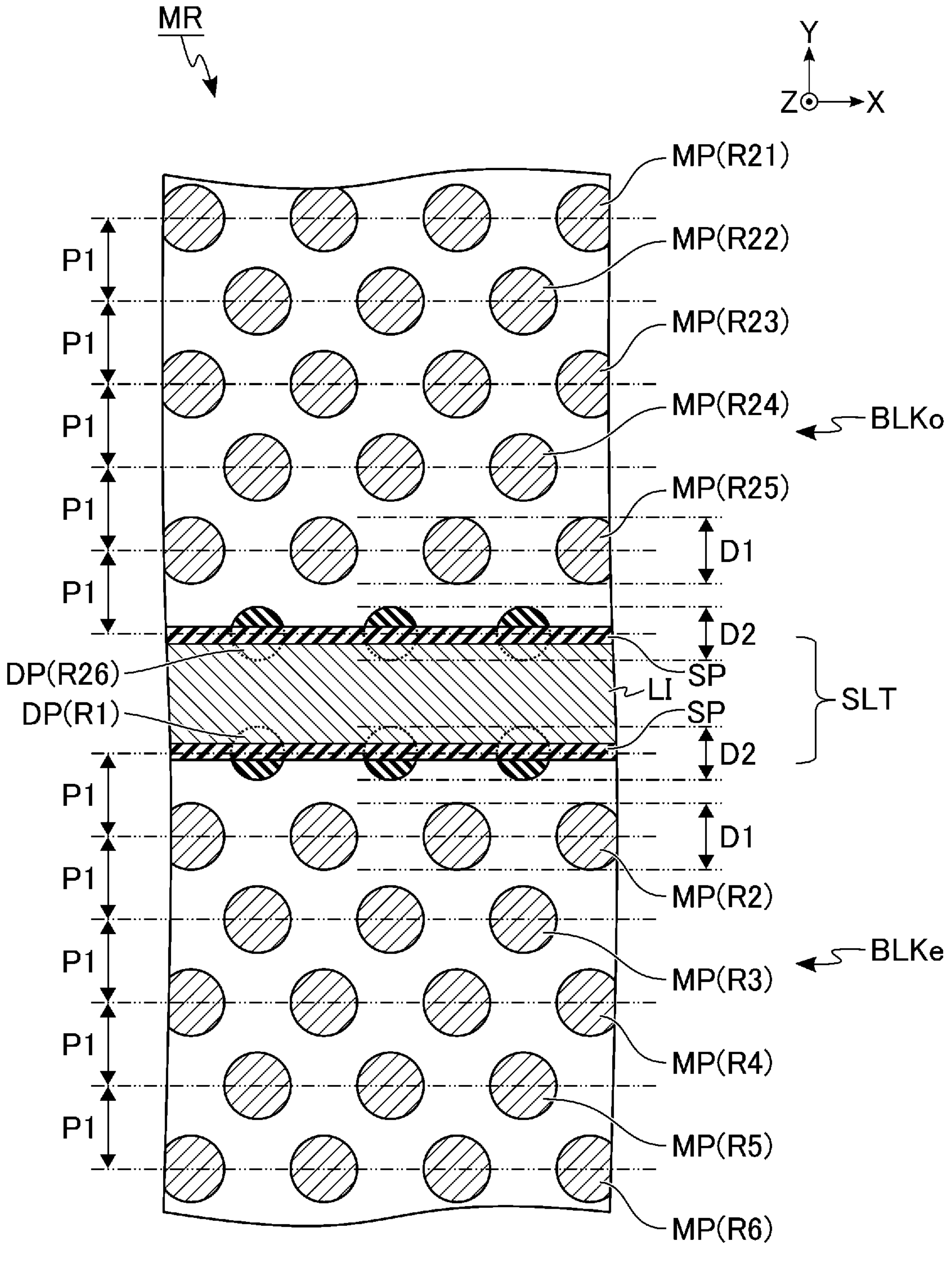
FIG. 7 is a plan view showing an example of a detailed layout of the vicinity of a slit provided in the memory cell array included in the memory device according to the first embodiment.

FIG. 7 is a plan view showing an example of a detailed layout of the vicinity of the slit SLT provided in the memory cell array 10 included in the memory device 1 according to the first embodiment. FIG. 7 shows extract parts of the adjacent blocks BLKo and BLKe of the plurality of blocks BLK0 through BLKn. In FIG. 7, a broken line indicates a virtual circle in the case where the semicircular dummy pillar DP has a perfect circular shape in the XY section. The virtual circle of the dummy pillar DP overlaps with the slit SLT. In the present description, a "diameter of the dummy pillar DP" refers to a diameter of a virtual circle of the dummy pillar DP. The "center of the dummy pillar DP" refers to a center of a virtual circle of the dummy pillar DP.

As shown in FIG. 7, the diameter of the memory pillar MP is D1. The diameter of the dummy pillar DP is D2, which is smaller than D1. In the set of the memory pillars MP and the dummy pillars DP arranged in a staggered manner, the pitches of the rows aligned in the Y direction are P1. In the present description, the pitches of multiple rows provided between two adjacent slits SLT correspond to intervals between the centers of the memory pillars MP or the dummy pillars DP provided in a row and those in another row with respect to the Y direction. Therefore, intervals between adjacent rows of memory pillars MP in the Y direction are approximately equal to intervals of a row of dummy pillars DP and an adjacent row of memory pillars MP in the Y direction.

In other words, the intervals in the Y direction between the centers of the dummy pillars DP in contact with the slit SLT and the centers of the memory pillars MP provided in a row adjacent to the dummy pillars DP in contact with the slit SLT are approximately the same as the pitches of the other memory pillars MP in a block BLK in the Y direction. Specifically, in a plan-view perspective, the intervals of the centers of the dummy pillars DP(R1) and the memory pillars MP(R2) in the Y direction, the intervals of the centers of the memory pillars MP(Ri) and MP(Ri+1) (i is an integer between 2 and 24) in the Y direction, and the intervals of the centers of the memory pillars MP(R25) and DP(R26) in the Y direction are approximately equal.

In FIG. 7, a plurality of dummy pillars DP(R26) of the block BLKo and a plurality of dummy pillars DP(R1) of the block BLKe are arranged in such a manner that they are adjacent to each other in the Y direction. The embodiment is not limited to this example; the dummy pillars DP(R26) of the block BLKo and the dummy pillars DP(R1) of the block BLKe may be arranged in such a manner that they are shifted in the X direction.

As described above, the memory device 1 according to the first embodiment includes a plurality of columnar members extending in the Z direction and arranged in a matrix of K rows (K is an integer equal to or greater than 4) aligned in the Y direction between the slits SLT adjacent to each other in the Y direction. The plurality of columnar members include a plurality of memory pillars MP arranged in multiple rows between the first row and the K-th row among K rows, and a plurality of dummy pillars DP arranged at the first row and the K-th row among K rows. The plurality of word lines WL are provided, spaced apart from each other in the Z direction. Each memory pillar MP includes a semiconductor layer 41 having a part provided so as to face each of the word line WL with respect to the Y direction. Each dummy pillar DP includes an insulating layer 50 having a part that is provided so as to face at least one of the word lines WL with respect to the Y direction, that is in contact with any one of the slits SLT adjacent to each other in the Y direction, and that is provided spaced apart from the conductive layer (the semiconductor substrate 20 or the source line SL) in the Z direction. The diameter of each dummy pillar DP is smaller than the diameter of each memory pillar MP at a location in the Z direction where a word line WL, among a plurality of word lines, facing both of multiple memory pillars MP and multiple dummy pillar DP in the Y direction is included.

<1-2> Manufacturing Method

Figure 8:
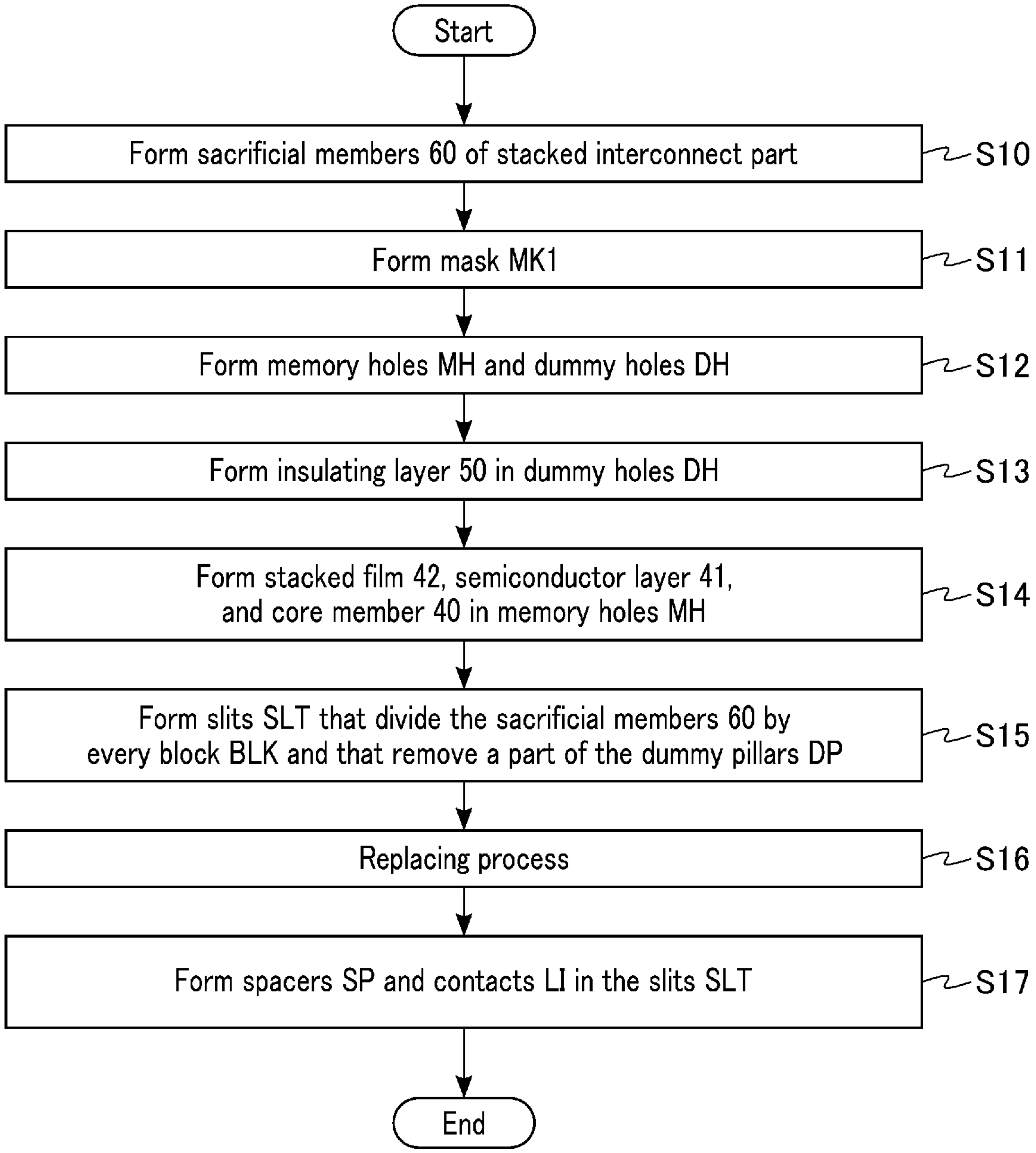
FIG. 8 is a flowchart showing an example of the manufacturing method of the memory device according to the first embodiment.

Next, a manufacturing method of the memory device 1 according to the first embodiment is described with reference to FIG. 8 as needed. FIG. 8 is a flowchart showing an example of the manufacturing method of the memory device 1 according to the first embodiment, and shows a part of the manufacturing process for forming stacked interconnects. Each of FIGS. 9 to 17 which will be referred to in this section shows an example of a planar layout or a sectional structure of the memory device 1 according to the first embodiment in the course of manufacturing. The planar layout that will be referred to in this section corresponds to an area in the vicinity of the slit SLT shown in FIG. 7. The sectional structure that will be referred to in this section schematically shows an area in which a pair of memory pillars MP and a pair of dummy pillars DP, with a single slit SLT being interposed therebetween with respect to the Y direction, are formed or slated to be formed. In the present description, a "stacked interconnect part" refers to a structure used for forming stacked interconnects including a plurality of word lines WL aligned in the Z direction.

Figure 9:
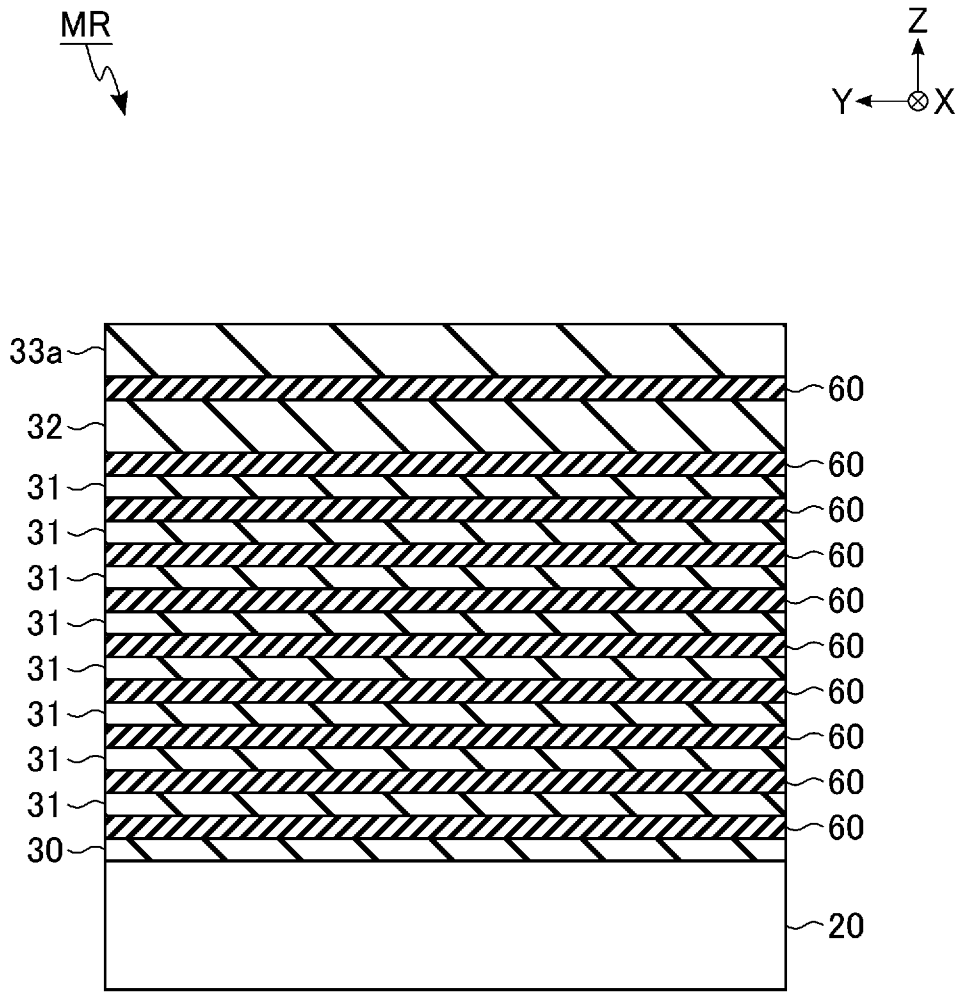
FIG. 9 is a sectional view showing an example of a sectional structure midway through the manufacturing of the memory device according to the first embodiment.

First, as shown in FIG. 9, sacrificial members 60 of a stacked interconnect part are stacked (step S10). Specifically, first, the sacrificial members 60 and the insulating layers 31 are alternately stacked on the insulating layer 30. Subsequently, the insulating layer 32 and the sacrificial member 60 are stacked on the uppermost layer of the sacrificial member 60, in this order. Next, a stepped structure of the sacrificial members 60 is formed in the hookup regions HR1 and HR2 (not shown) by, for example, slimming or etching. The steps formed by forming the step structure of the sacrificial members 60 are embedded by the insulating layer 33*a*. Then, the upper surface of the insulating layer 33*a* is flattened. The sacrificial members 60 are, for example, silicon nitride (SiN). Depending on a design of the memory cell array 10, the forming of the stepped structure of the sacrificial members 60 may be omitted.

Figure 10:
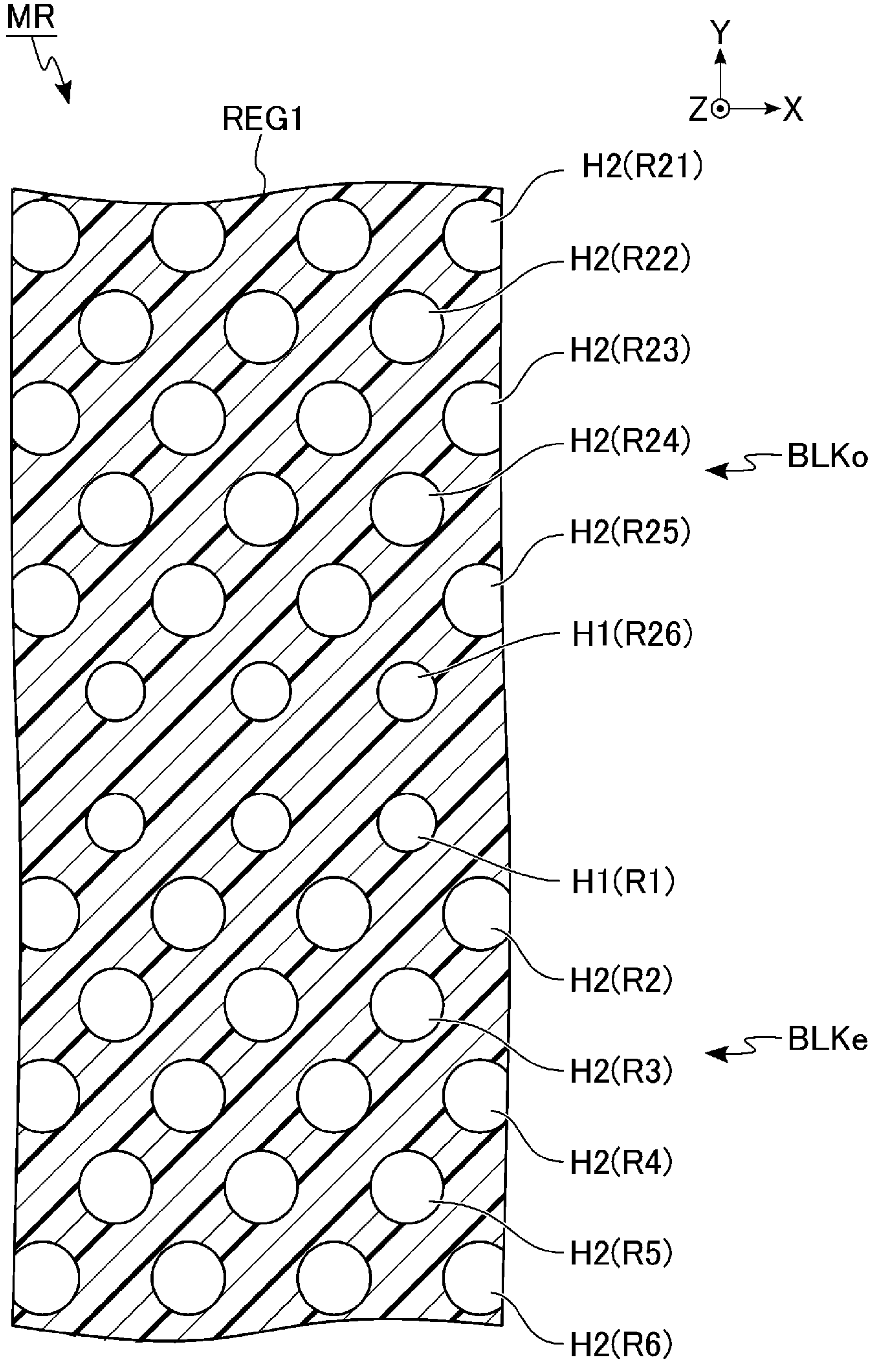
FIG. 10 is a plan view showing an example of a planar layout midway through the manufacturing of the memory device according to the first embodiment.
Figure 11:
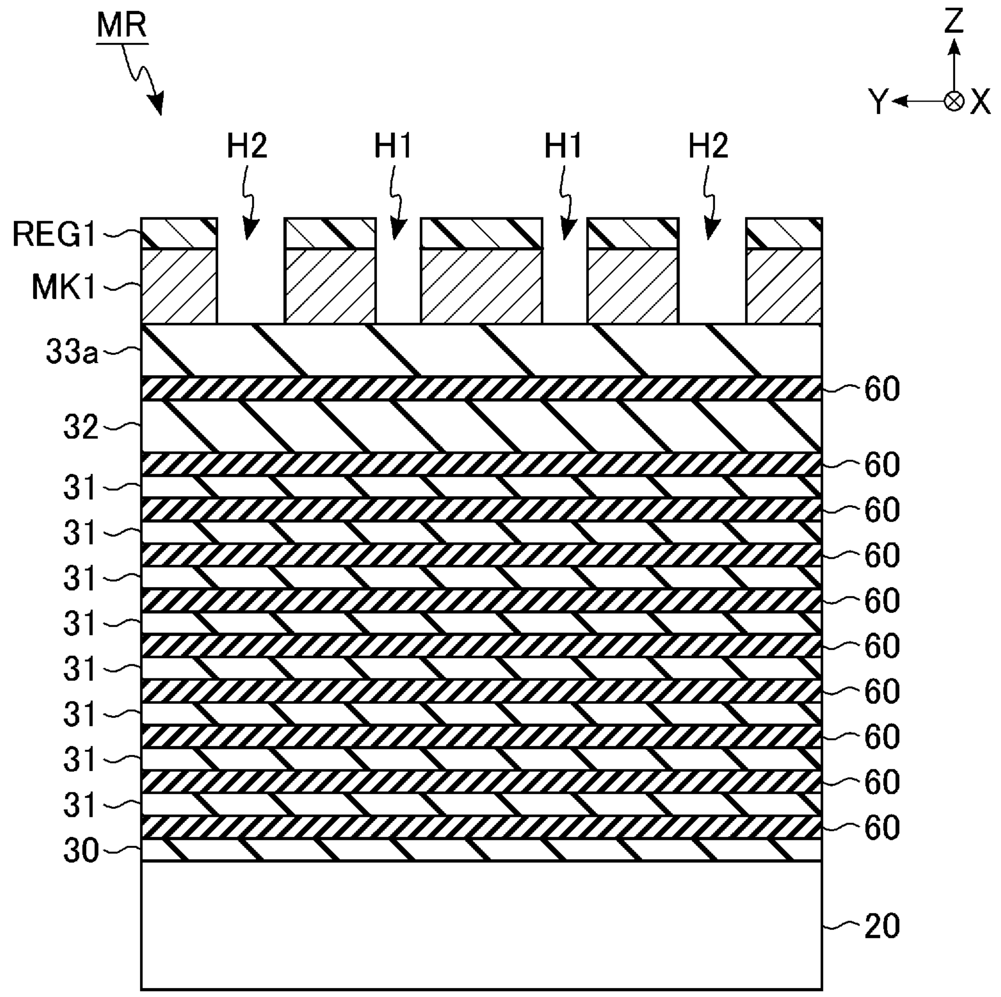
FIGS. 11 to 14 are sectional views showing an example of a sectional structure midway through the manufacturing of the memory device according to the first embodiment.

Next, a mask MK1 is formed (step S11). Specifically, first, a mask member (e.g., carbon) used as a mask for etching deep holes is formed on the insulating layer 33*a*. Then, a resist material REG1 is applied to the mask member. Then, the resist material REG1 is processed into a shape having a plurality of holes H1 and a plurality of holes H2 by photolithography, as shown in FIG. 10. The plurality of holes H1 are provided so as to correspond to the locations at which respective dummy pillars DP are formed. The plurality of holes H2 are provided so as to correspond to the locations at which respective memory pillars MP are formed. Thereafter, the mask member is processed by anisotropic etching using the resist material REG1 as a mask. As a result, as shown in FIG. 11, the shape of the resist material REG1 is transferred onto the mask member, and a mask MK1 having a plurality of holes H1 and H2 is thereby formed.

Figure 12:
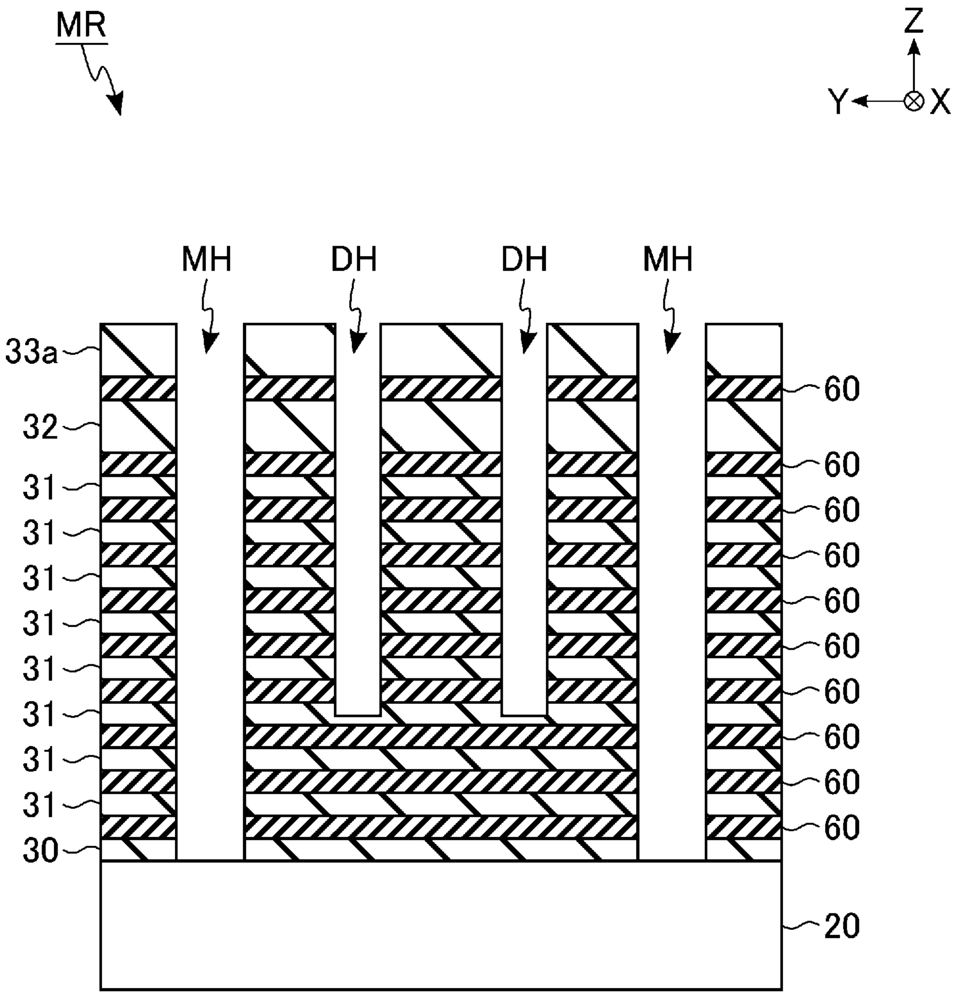

Next, memory holes MH and dummy holes DH are formed as shown in FIG. 12 (step S12). Specifically, anisotropic etching is performed using the mask MK1 as a mask. The anisotropic etching used in step S12 is, for example, RIE (Reactive Ion Etching). In RIE, if the holes H1 and H2 are formed at the same pitches on the mask MK1, the smaller the holes H1 and H2 are, the more the progress of etching in the height direction (Z direction) may be suppressed. For this reason, in the process in step S12, a difference in the positions (levels) of the bottoms that are formed by anisotropic etching may occur depending on a difference in diameters between the holes H1 and H2.

Specifically, a plurality of memory holes MH are formed by processing the insulating layers 30 to 32 and 33*a* and the sacrificial members 60 via the holes H2 of the mask MK1. By this processing, the surface of the semiconductor substrate 20 is exposed in the bottom of each memory hole MH. Furthermore, a plurality of dummy holes DH are formed by the processing of the insulating layers 31, 32, and 33*a*, and a plurality of layers of the sacrificial members 60 via the plurality of holes H1 of the mask MK1. By this processing, the bottom of each dummy hole DH reaches halfway through the level at which a plurality of word lines WL are slated to be stacked, for example. In the first embodiment, it suffices that the bottom of each dummy hole DH does not reach the semiconductor substrate 20. Thereafter, the mask MK1 is removed.

Figure 13:
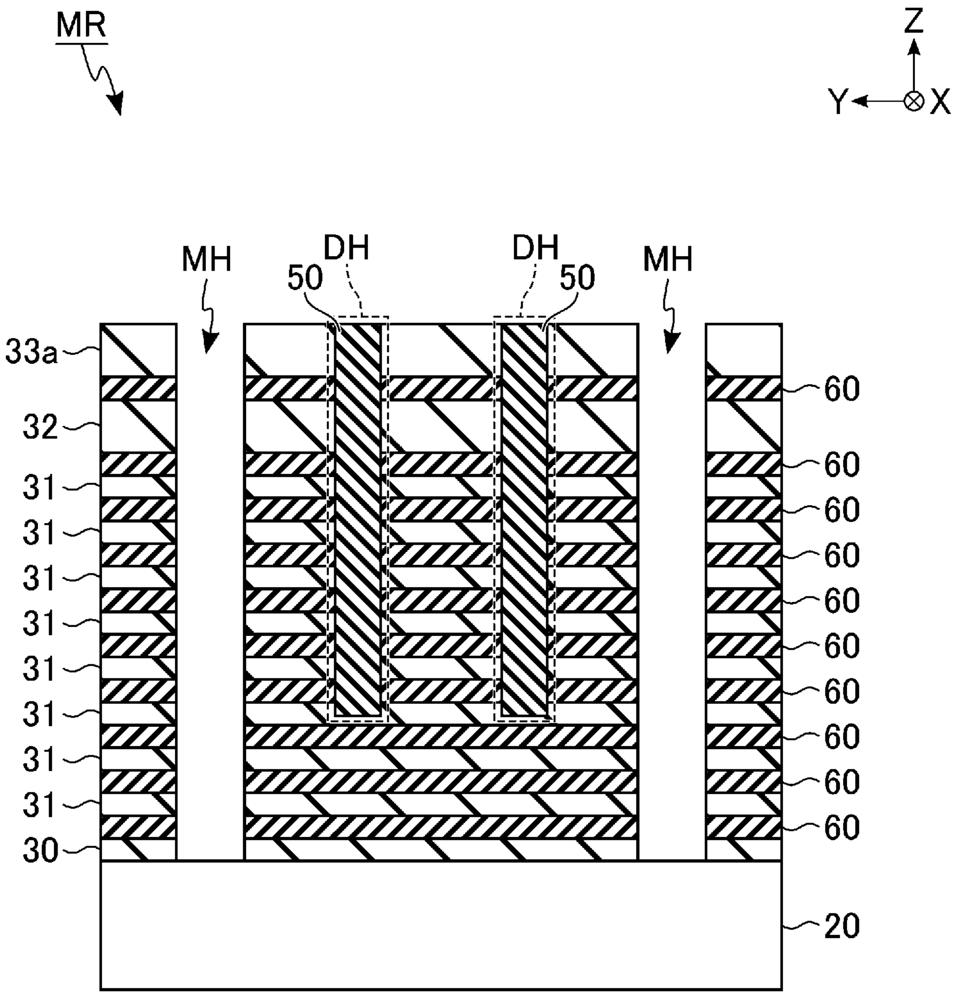

Next, as shown in FIG. 13, an insulating layer 50 is formed in the dummy holes DH (step S13). Specifically, the insulating layer 50 is formed in each of the dummy holes DH and the memory holes MH by chemical vapor deposition (CVD). As a result, a structure corresponding to a dummy pillar DP is formed in the dummy holes DH. Thereafter, the insulating layer 50 in the memory holes MH is selectively removed by, for example, a combination of lithography and etching.

Figure 14:
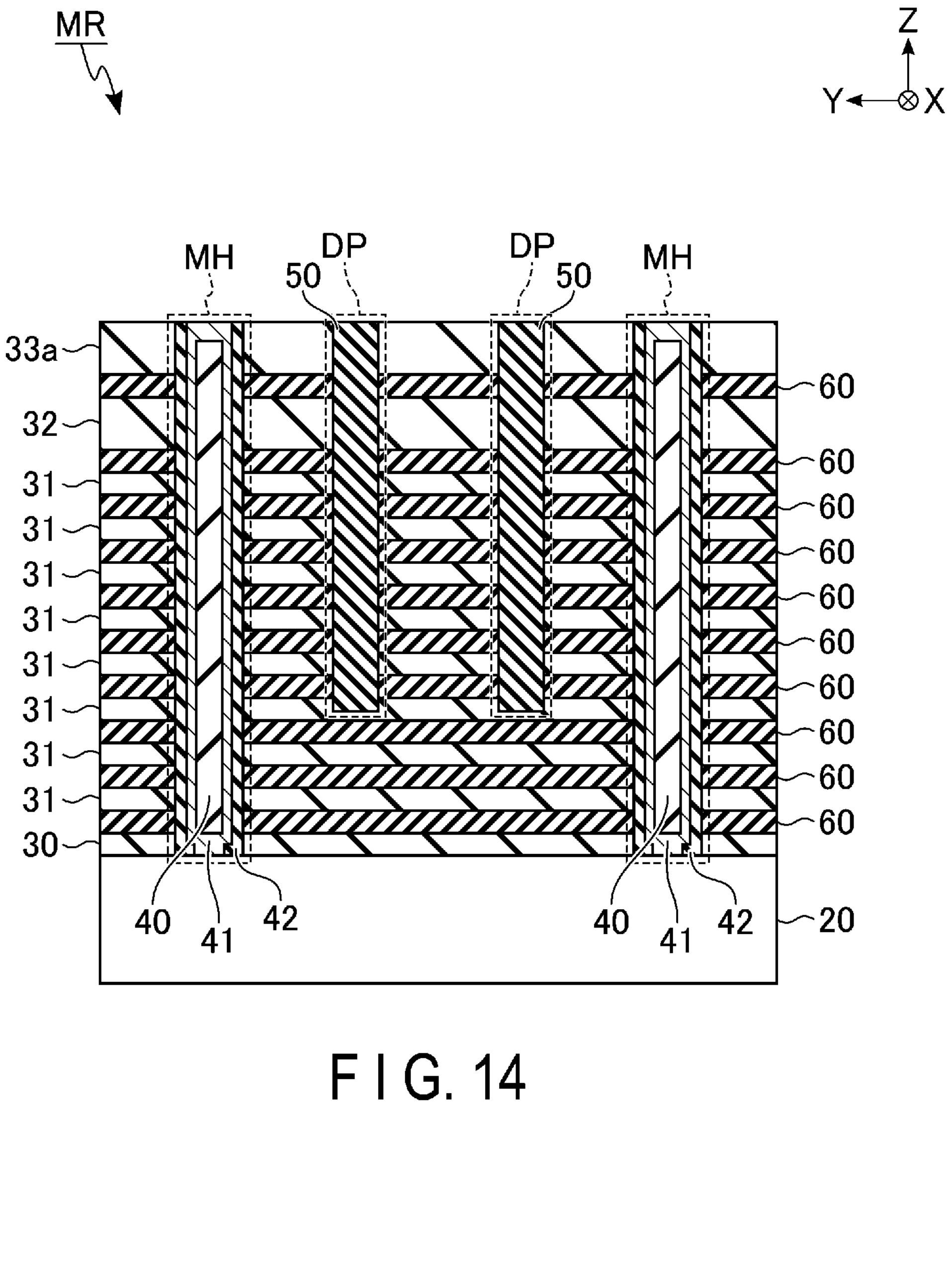

Next, as shown in FIG. 14, a stacked film 42, a semiconductor layer 41, and a core member 40 are formed in the memory holes MH (step S14). Specifically, the stacked film 42 (namely, a block insulating film 45, an insulating film 44, and a tunnel insulating film 43), the semiconductor layer 41, and the core member 40 are formed in this order on the side surfaces and the bottom surfaces of the memory holes MH. Thereafter, a part of the core member 40 provided at an upper part of the memory holes MH is removed, and the semiconductor layer 41 is formed in the part from which the core member 40 is removed. As a result, a structure corresponding to the memory pillar MP is formed in the memory hole MH. Thereafter, the stacked film 42, the semiconductor layer 41, and the core member 40 located above the insulating layer 33*a* are removed by chemical mechanical polishing (CMP).

Figure 15:
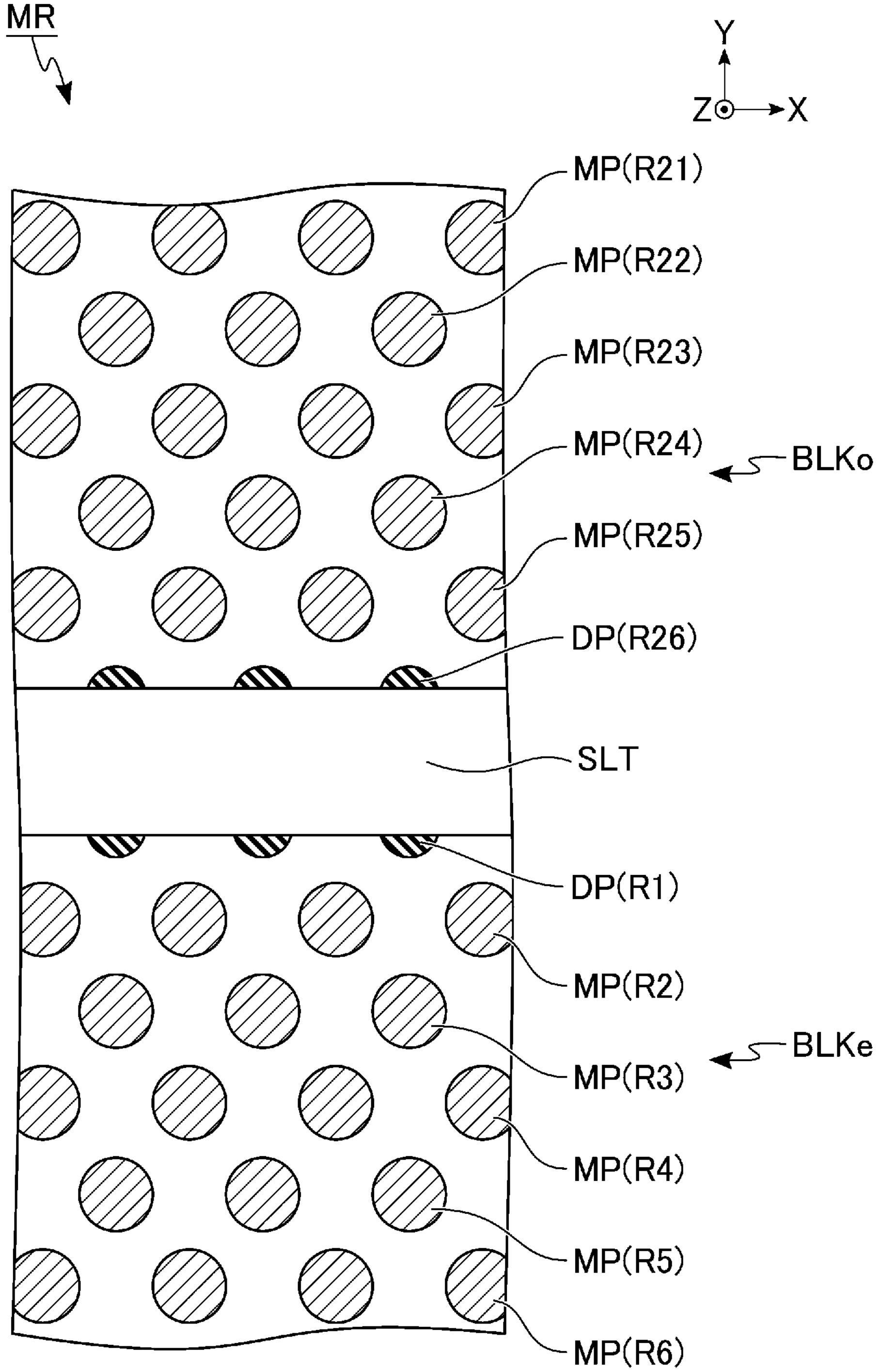
FIG. 15 is a plan view showing an example of a planar layout midway through the manufacturing of the memory device according to the first embodiment.
Figure 16:
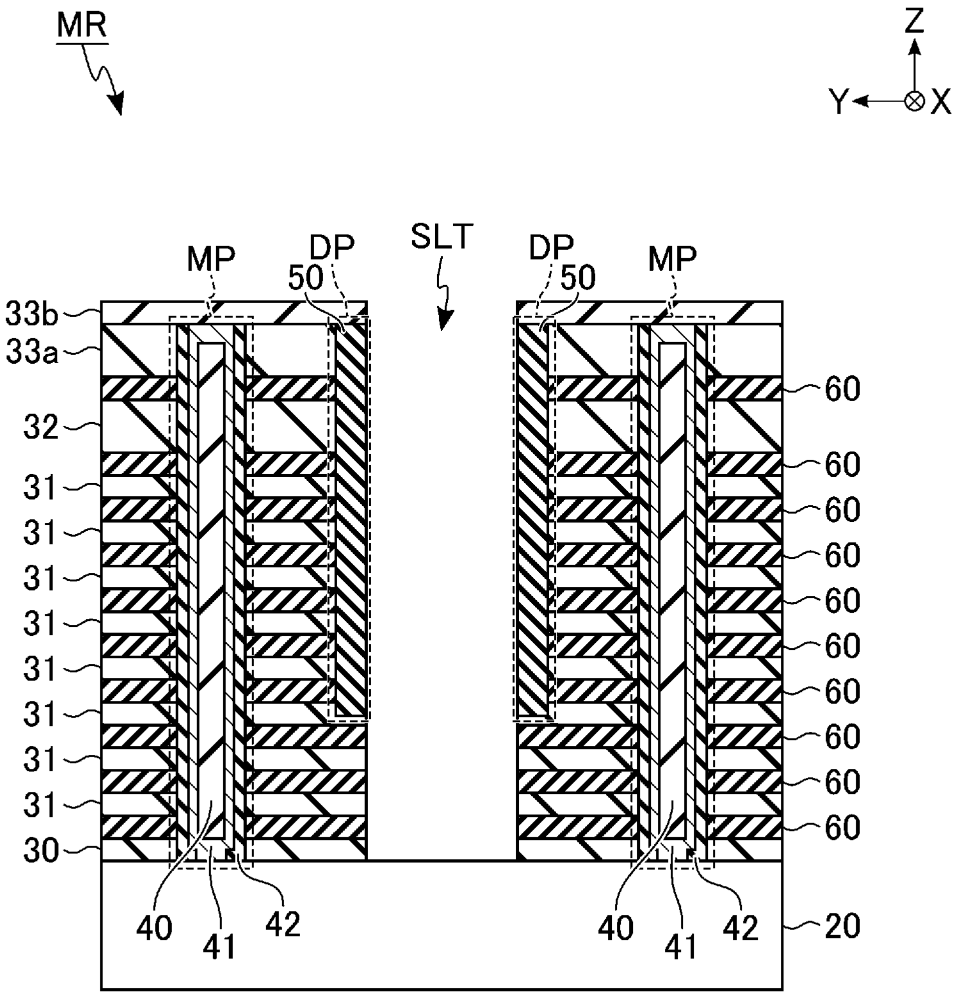
FIGS. 16 and 17 are sectional views showing an example of a sectional structure midway through the manufacturing of the memory device according to the first embodiment.

Next, slits SLT that divide the sacrificial members 60 by every block BLK and that remove a part of the dummy pillars DP are formed (step S15). Specifically, an insulating layer 33*b* is first formed on the insulating layer 33*a* so as to protect the memory pillars MP. Then, a slit SLT is formed in such a manner that a part of each of the dummy pillars DP are removed when viewed in a plan-view perspective by a combination of photolithography and anisotropic etching, as shown in FIG. 15. The slit SLT divides the insulating layers 30 to 32, 33*a*, and 33*b*, and the sacrificial members 60, as shown in FIG. 16. By this processing, the surface of the semiconductor substrate 20 is exposed in the bottom of the slit SLT.

Next, a replacing process is performed (step S16). Specifically, the sacrificial members 60 are selectively removed via the slit SLT by wet etching using hot phosphoric acid or the like. Thereafter, a conductor is embedded in the space from which the sacrificial members 60 have been removed, via the slit SLT. To form the conductor in this step, CVD is used for example. After that, the conductor formed inside the slit SLT is removed by an etch-back process, and the conductor formed in adjacent spaces is separated into multiple layers. Accordingly, a conductive layer 21 functioning as a selection gate line SGS, a plurality of conductive layers 22 each functioning as a word line WL, and a conductive layer 23 functioning as a selection gate line SGD are formed.

Figure 17:
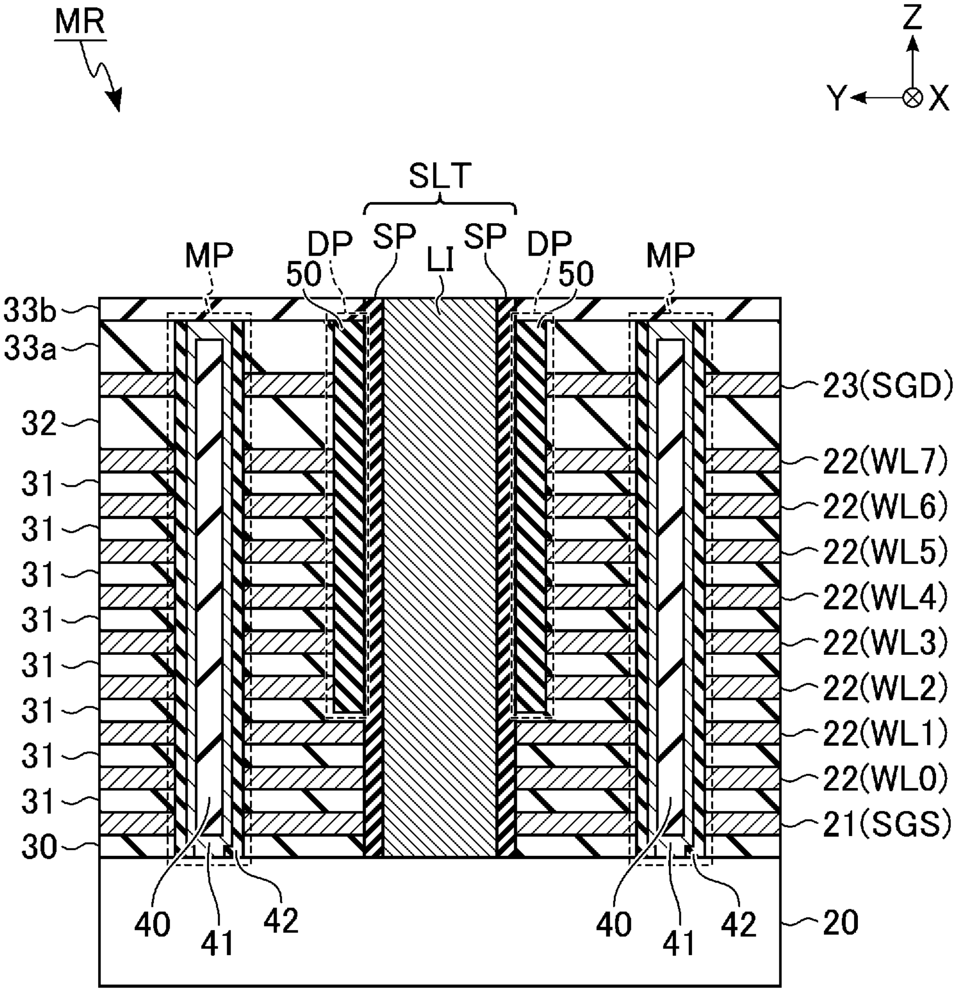

Next, spacers SP and contacts LI are formed in the slits SLT (step S17). Specifically, as shown in FIG. 17, insulating films slated to be used as the spacers SP are first formed. Then, the insulating film formed in the bottom of the slit SLT is removed by an etch-back process. Thereafter, a conductor is formed so as to fill the slit SLT, and the conductor outside the slit SLT is removed. Thus, a structure in which the spacers SP and the contact LI remain in the slit SLT is formed. After the process in step S17 is finished, the series of processes shown in FIG. 8 is finished (End).

<1-3> Effects of First Embodiment

According to the memory device 1 of the first embodiment as described above, it is possible to improve yield of the memory device 1 and to improve operation characteristics. The details of advantageous effects of the first embodiment are described below. In the following, an area in which the slit SLT and the dummy pillars DP are formed will be called a "slit area SLTA".

It is possible to increase a storage capacity of a memory device in which memory cells are stacked in a three-dimensional manner by increasing the number of stacked word lines WL. To increase a storage capacity, it is preferable that memory pillars MP penetrating stacked word lines WL be arranged closely. For the processing of memory holes MH for forming memory pillars MP, deep-hole etching is used. Being arranged closely and in a staggered manner, memory holes MH in the end row are difficult to be processed with deep-hole etching, and such memory holes MH may not have a proper opening.

Figure 18:
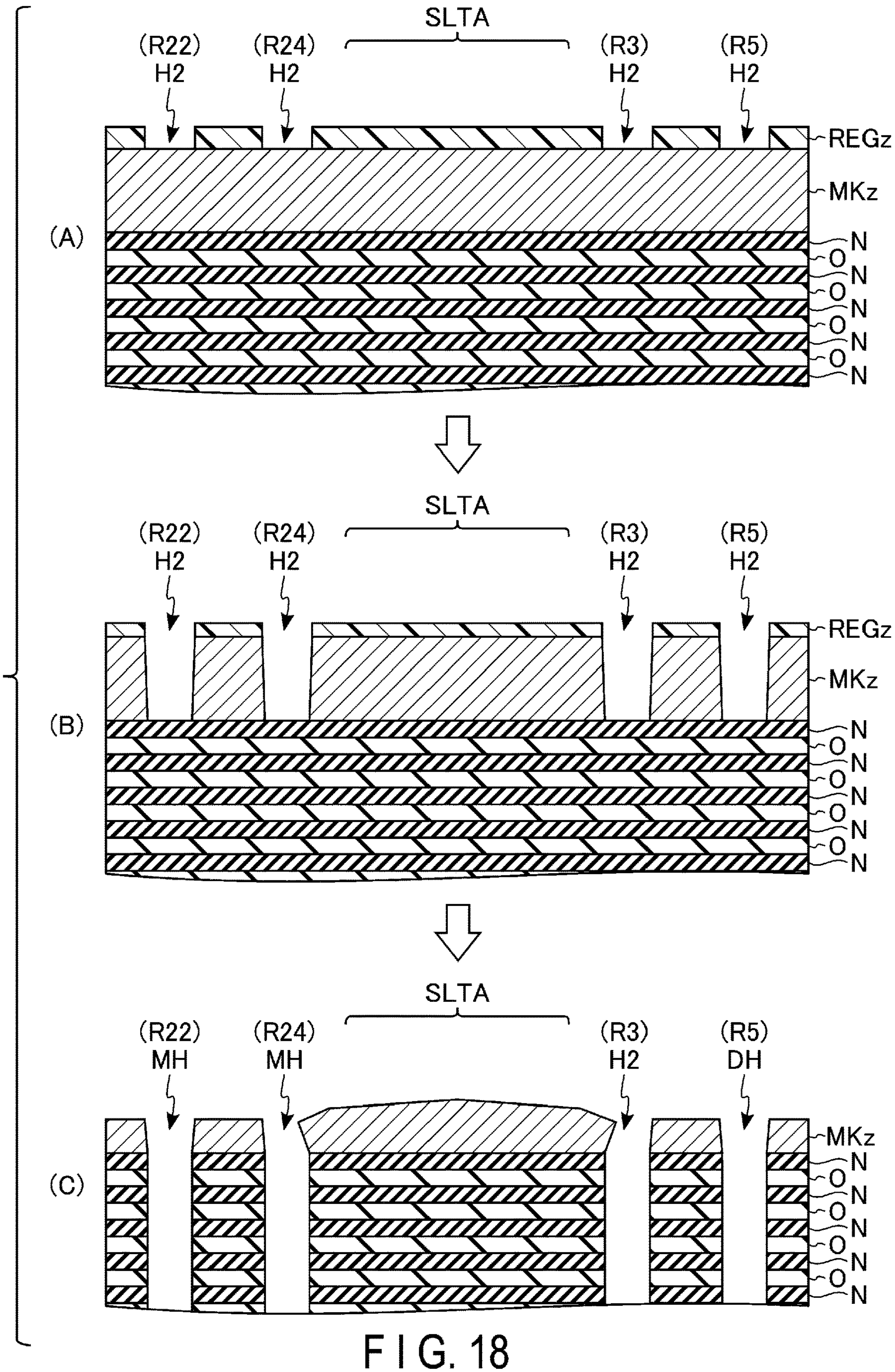
FIG. 18 is a schematic view showing an example of a change in a shape of a mask in an etching process for forming a memory hole MH of a comparative example.

FIG. 18 is a schematic view showing an example of a change in the shape of a mask MKz in the etching process for forming memory holes MH of a comparative example. "O" and "N" shown in FIG. 18 correspond to an insulating layer and a sacrificial member, respectively. As shown in (A) of FIG. 18, in the comparative example, a resist material REGz is formed without the holes H1 in the slit area SLTA in the process in step S11. Then, as shown in (B) of FIG. 18, a mask MKz is processed based on a shape of the resist material REGz, and the openings based on a plurality of holes H2 are formed on the mask MKz. Then, as deep-hole etching using the mask MKz progresses, a by-product of the processing may be accumulated on the side part of the mask MKz in the slit area SLTA, as shown in (C) of FIG. 18.

Thus, in the comparative example, the mask MKz in the slit area SLTA may project into the memory holes MH arranged in the end row. Such projection of the mask MKz inhibits the processing of the memory holes MH arranged in the end row, and may be a reason for unopened memory holes MH in the end row or a reason for the bottom of the memory hole MH not reaching a desirable level. To avoid unopened memory holes MH in the end row, a Y-direction dimension of the memory hole MH arranged in the end row may be increased through the mask design. However, the change of an XY difference in the dimensions of the memory holes MH through the mask design may cause a difference in shape between the top part and the bottom part of a memory pillar MP (top-bottom difference) or a dimensional difference between a memory pillar MP arranged at the end row and a memory pillar MP arranged in a middle row. Furthermore, an ellipse component remaining in the memory pillar MP may cause a decrease in program speed.

Figure 19:
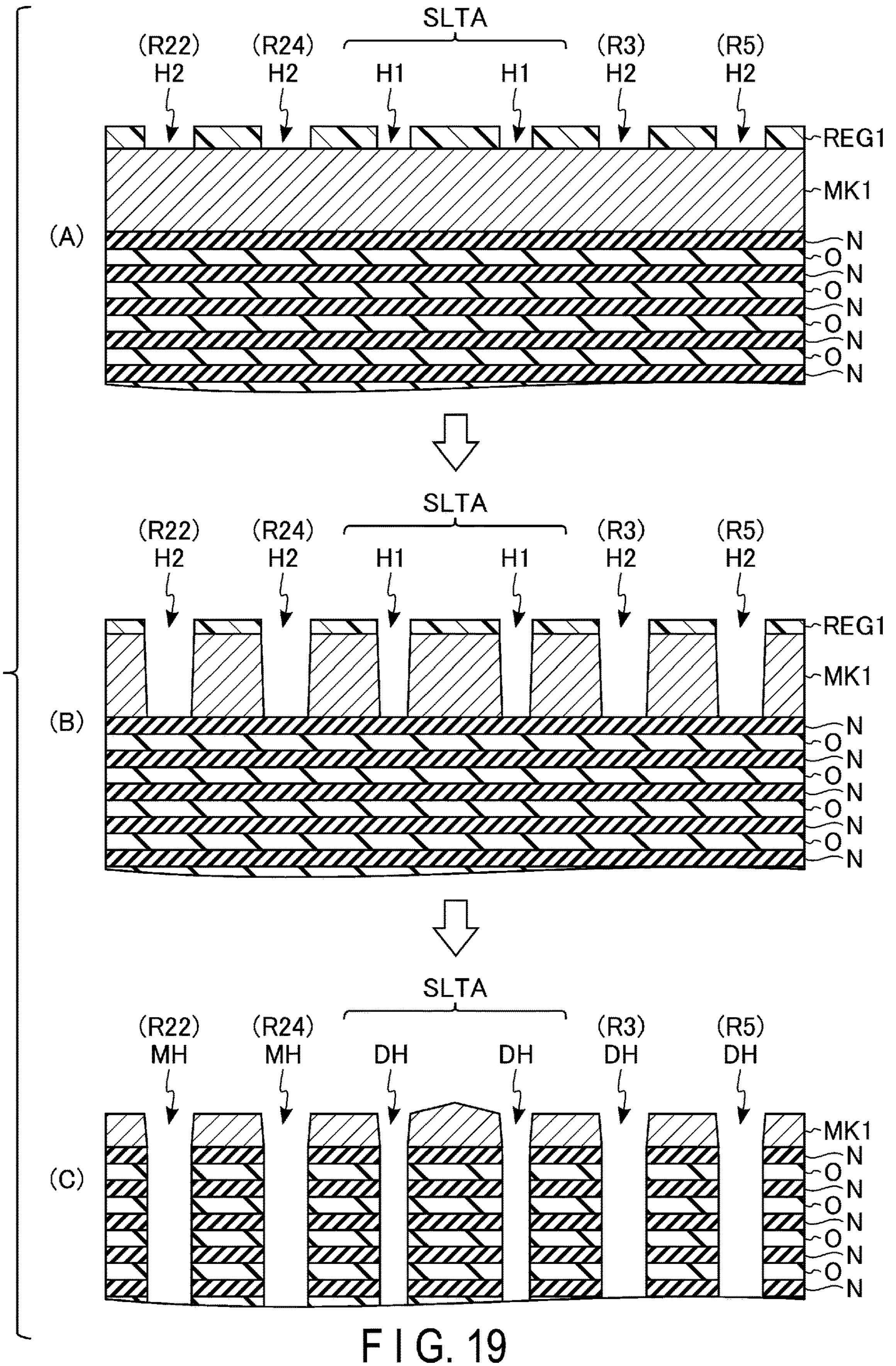
FIG. 19 is a schematic view showing an example of a change in a shape of a mask in an etching process for forming a memory hole MH of the first embodiment.

For these reasons, in the memory device 1 according to the first embodiment, a dummy pattern constituted by an insulator (dummy pillars DP) is arranged in the slit area SLTA. FIG. 19 is a schematic view showing an example of a change in the shape of the mask MK1 in the etching process for forming the memory holes MH of the first embodiment, and shows the same area and process as those of FIG. 18. As shown in (A) of FIG. 19, in the first embodiment, a resist material REG1 including the holes H1 in the slit area SLTA is formed in the process in step S11. Then, as shown in (B) of FIG. 19, the mask MK1 is processed based on a shape of the resist material REG1, and the openings based on a plurality of holes H1 and H2 are formed on the mask MK1. Then, as deep-hole etching using the mask MK1 progresses, accumulation of by-products of the processing on the side part of the mask MK1 in the slit area SLTA is suppressed because the plurality of holes H1 have been formed, as shown in (C) of FIG. 19.

As described above, in the memory device 1 according to the first embodiment, a projection of the mask MK1 in the slit area SLTA toward the memory hole MH arranged in the end row is suppressed. As a result, the memory device 1 according to the first embodiment can suppress occurrence of unopened memory hole MH without increasing the Y-direction dimension of the memory holes MH arranged in the end row. A top-bottom difference and an inner-outer difference in the memory pillar MP may be suppressed and a decrease in program speed may be suppressed. Therefore, the memory device 1 according to the first embodiment can improve yield and operation characteristics of the memory device 1.

The memory device 1 of the first embodiment has a structure in which the dummy pillars DP are embedded by the insulating layer 50 (e.g., a silicon oxide film). In this case, at the time of processing the slit SLT, the progress of etching is accelerated in the part where the dummy pillars DP are formed. Furthermore, if the bottom of the dummy pillars DP reach the semiconductor substrate 20 similarly to the memory pillars MP, for example, variations in processed states of the bottom of the slit SLT may occur between the part overlapping with the dummy pillars DP and the part not overlapping with the dummy pillars DP.

For this reason, the memory device 1 according to the first embodiment has a structure in which the bottoms of the dummy pillars DP are terminated halfway through the stacked interconnect. It is thereby possible to suppress variations in processed states of the bottom of the slit SLT between the part overlapping with the dummy pillars DP and the part not overlapping with the dummy pillars DP. As a result, in the memory device 1 according to the first embodiment, a coupling between the impurity diffusion layer area and the contact LI in the semiconductor substrate 20 may be improved. In an interconnect through which the dummy pillars DP do not penetrate, an interconnect resistance may be reduced. Therefore, the memory device 1 according to the first embodiment can improve operation characteristics.

<2> Second Embodiment

The memory device 1 according to the second embodiment achieves the same advantageous effect as the first embodiment through the structure and the arrangement of the dummy pillars DP, which differ from those of the first embodiment. In the following, differences between the memory device 1 of the second embodiment and that of the first embodiment will be mainly described.

<2-1> Configuration

First, a configuration of the memory device 1 according to the second embodiment is described. The structure of the memory device 1 according to the second embodiment is the same as the memory device 1 according to the first embodiment, except that the structure and arrangement of the dummy pillars DP differ from those in the first embodiment. In the following, the dummy pillar DP of the memory device 1 according to the second embodiment will be called a "dummy pillar DPa".

Figure 20:
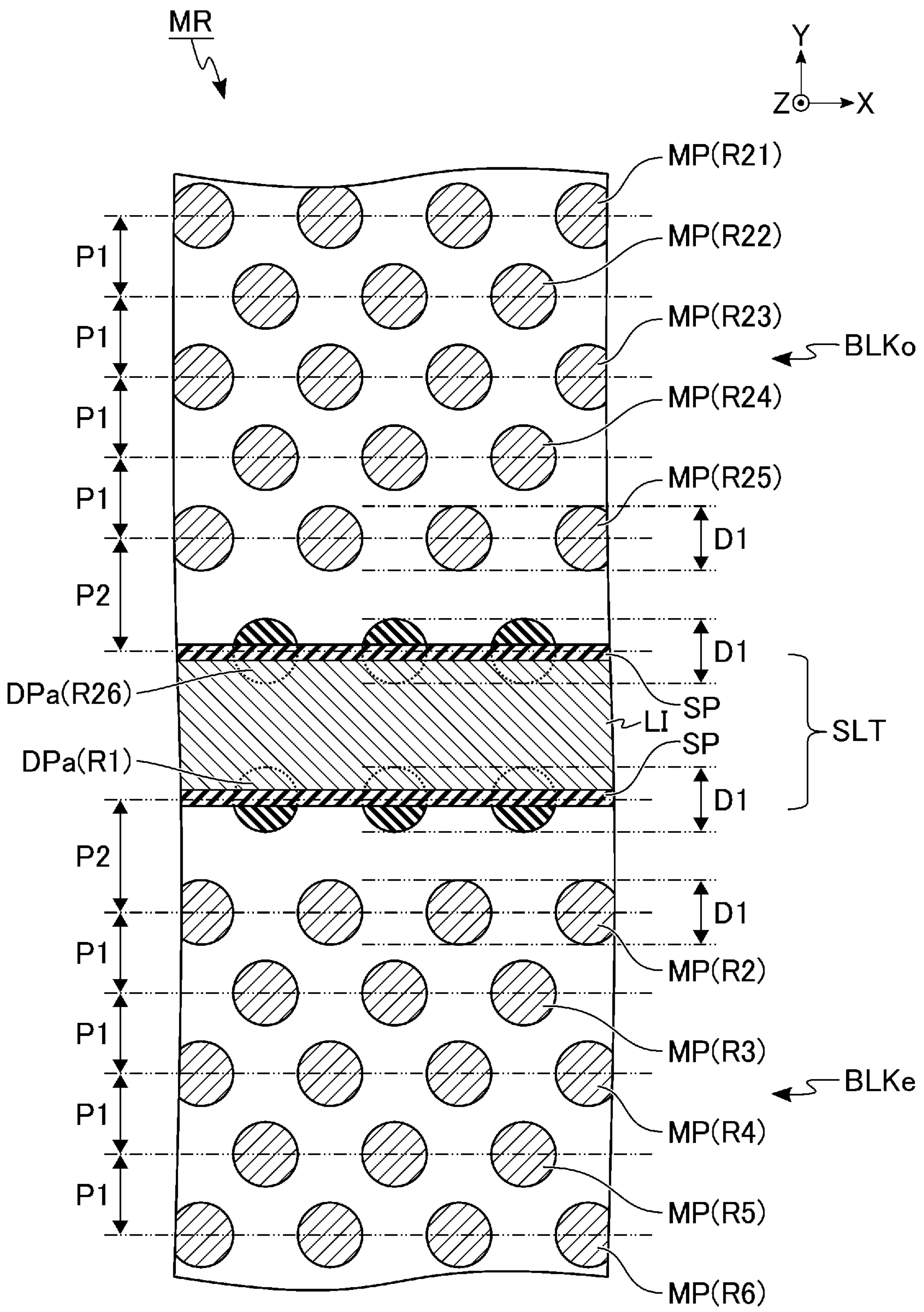
FIG. 20 is a plan view showing an example of a planar layout in a memory region of a memory cell array included in a memory device according to a second embodiment.

FIG. 20 is a plan view showing an example of a planar layout in the memory region MR of the memory cell array 10 included in the memory device 1 according to the second embodiment. FIG. 20 shows extracted parts of the adjacent blocks BLKo and BLKe. In FIG. 20, a broken line indicates a virtual circle in the case where the semicircular dummy pillar DPa has a perfect circular shape in the XY section. The virtual circle of the dummy pillar DPa overlaps with the slit SLT.

As shown in FIG. 20, the diameter of the dummy pillar DPa and that of the memory pillar MP are D1. In other words, in the second embodiment, the diameter of the dummy pillar DPa is approximately the same as the diameter of the memory pillar MP. In the set of the memory pillars MP and the dummy pillars DPa arranged in a staggered manner, the pitches of the rows that include a plurality of memory pillars MP and are aligned in the Y direction are P1. The pitches between a row of the dummy pillars DPa and a row of the memory pillars MP that is adjacent to the row of the dummy pillars DPa are P2 wider than P1. Specifically, in a plan-view perspective, the intervals of the centers of the dummy pillars DPa(R1) and the memory pillars MP(R2) in the Y direction and the intervals of the centers of the memory pillars MP(R25) and the dummy pillars DPa(R26) are wider than the intervals of the centers of the memory pillars MP(Ri) and MP(Ri+1) in the Y direction (i is an integer between 2 and 24).

In FIG. 20, a plurality of dummy pillars DPa(R26) of the block BLKo and a plurality of dummy pillars DPa(R1) of the block BLKe are arranged in such a manner that they are adjacent to each other in the Y direction. The embodiment is not limited to this example; the dummy pillars DPa(R26) of the block BLKo and the dummy pillars DPa (R1) of the block BLKe may be arranged in such a manner that they are shifted in the X direction. The other configurations of the memory device 1 of the second embodiment are similar to those of the first embodiment. The symbol "i" used in the foregoing descriptions may be changed as appropriate depending on the number of rows of the memory pillar MP and the dummy pillars DP arranged between two adjacent slits SLT.

<2-2> Manufacturing Method

The memory device 1 according to the second embodiment may be manufactured through the same steps as the manufacturing method of the memory device 1 according to the first embodiment shown in FIG. 8, except that the arrangements of some patterns are different. For example, in the memory device 1 according to the second embodiment, in the process of step S12, the arrangement and design of the dummy holes DH are changed to those based on a layout of the dummy pillars DPa shown in FIG. 20. In other words, in the second embodiment, the diameter of the holes H1 associated with the dummy pillars DPa is designed to be the same as the diameter of the memory holes MH. Furthermore, the holes H1 associated with the dummy pillars DPa are arranged with respect to the memory holes MH arranged in a staggered manner in pitches wider than the pitches in which the rows of memory holes MH are arranged in the Y direction.

For example, in RIE, if holes having the same diameter are arranged on a mask in a periodic manner, the progress of etching in a height direction (Z direction) is suppressed in the part where the holes are arranged in wide pitches. For this reason, in the second embodiment, a difference in the positions (levels) of the bottoms formed by anisotropic etching may occur in the process of step S12 based on a difference in respective pitches of the holes H1 and the holes H2. Specifically, in the process of step S12, a structure in which the bottom of the memory hole MH is in contact with the semiconductor substrate 20 and the bottom of the dummy hole DH is interrupted halfway through the stacked interconnect part is formed. Thereafter, in the process of step S15, the slits SLT are formed so as to remove parts of the dummy pillars DPa. Other steps of the manufacturing method of the memory device 1 according to the second embodiment are the same as those of the first embodiment.

<2-3> Effects of Second Embodiment

In the memory device 1 according to the second embodiment, similarly to the first embodiment, formation of the dummy pillars DPa suppresses a projection of the mask MK1 in the slit area SLTA toward the memory hole MH arranged in the end row. Since the bottoms of the dummy pillars DPa are interrupted halfway through the stacked interconnect similarly to the dummy pillars DP of the first embodiment, this structure may suppress variations in the processed states of the bottom of the slit SLT. Therefore, the memory device 1 according to the second embodiment can improve yield and operation characteristics of the memory device 1, similarly to the first embodiment.

<3> Third Embodiment

The memory device 1 of the third embodiment has a structure in which the memory cell array 10 having the memory pillars MP each divided into multiple tiers is combined with the dummy pillars DP of the first embodiment. In the following, differences in the memory device 1 between the third embodiment and the first and second embodiments will be mainly described.

<3-1> Configuration

First, a configuration of the memory device 1 according to the third embodiment is described. The structure of the memory device 1 according to the third embodiment is the same as the memory device 1 according to the first embodiment except the structure of the memory cell array 10. In the third embodiment, an example in which each NAND string NS includes 24 memory cell transistors MT0 to MT23 respectively coupled to word lines WL0 through WL23 is described. In the following, the memory pillar MP of the memory device 1 according to the third embodiment will be called a "memory pillar MPa".

Figure 21:
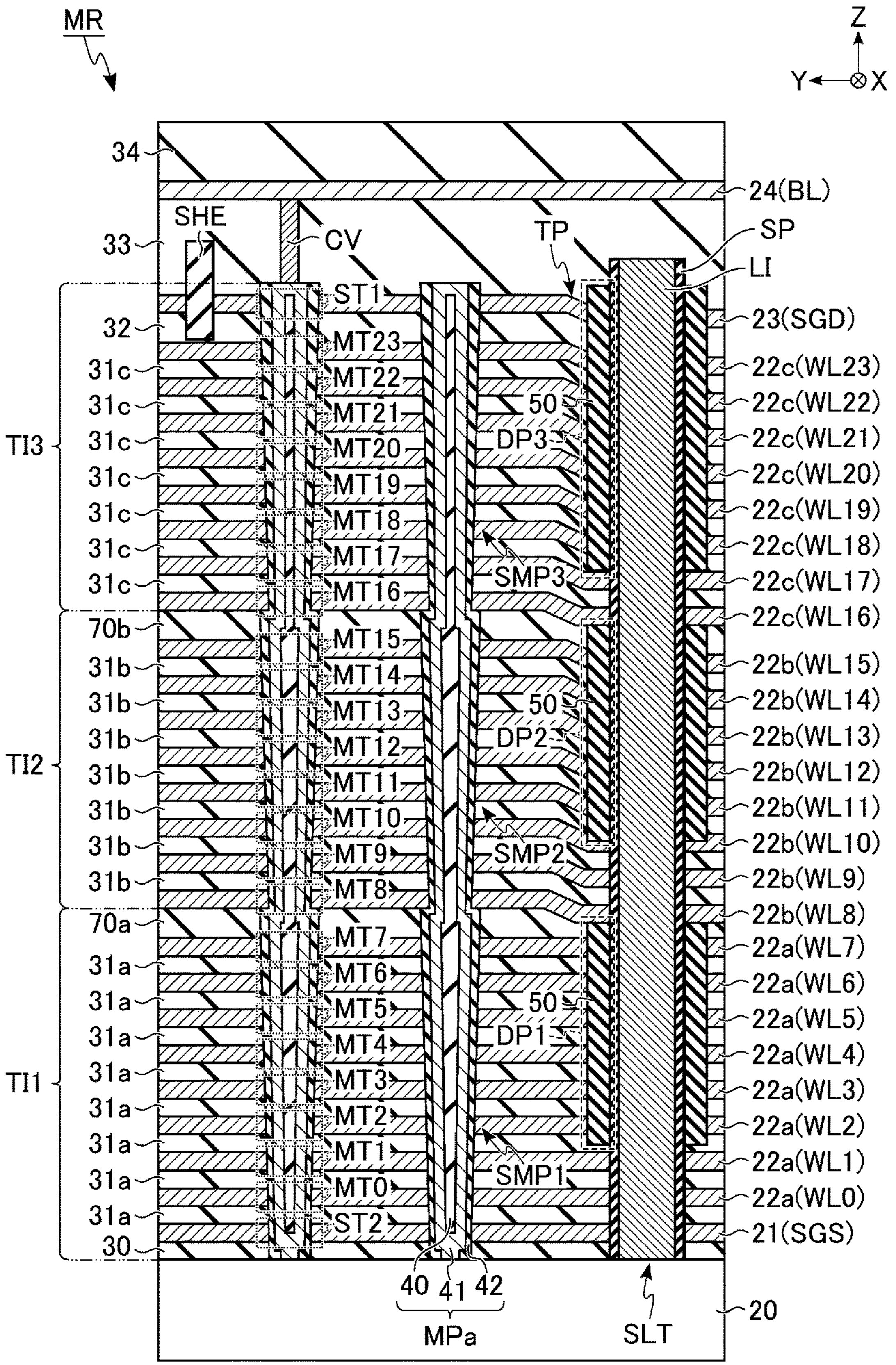
FIG. 21 is a sectional view of a memory cell array included in a memory device according to a third embodiment.

FIG. 21 is a sectional view of the memory cell array 10 included in the memory device 1 according to the third embodiment. As shown in FIG. 21, the memory device 1 of the third embodiment includes, in the memory region MR, a semiconductor substrate 20, conductive layers 21, 22*a*, 22*b*, 22*c*, 23, and 24, insulating layers 30, 31*a*, 31*b*, 31*c*, 32 to 34, 70*a*, and 70*b*, memory pillars MPa, slits SLT and SHE, and dummy pillars DP1 through DP3, for example.

In the memory cell array 10 of the third embodiment, the structure between the conductive layer 21 and the insulating layer 32 differs from that of the first embodiment. Specifically, the insulating layers 31*a* and the conductive layers 22*a* are alternately stacked on the conductive layer 21. The insulating layer 70*a* is provided on the uppermost conductive layer 22*a*. The conductive layers 22*b* and the insulating layers 31*b* are alternately stacked on the insulating layer 70*a*. The insulating layer 70*b* is provided on the uppermost conductive layer 22*b*. The conductive layers 22*c* and the insulating layers 31*c* are alternately stacked on the insulating layer 70*b*. The insulating layer 32 is provided on the uppermost conductive layer 22*c*.

Each of the conductive layers 22*a*, 22*b*, and 22*c* is formed in a plate-like shape along with the XY plane, for example. The eight stacked conductive layers 22*a* are used as word lines WL0 to WL7 in the named order from the conductive layer 21 side. The eight stacked conductive layers 22*b* are used as word lines WL8 to WL15 in the named order from the conductive layer 21 side. The eight stacked conductive layers 22*c* are used as word lines WL16 to WL23 in the named order from the conductive layer 21 side. The conductive layers 22*a*, 22*b*, and 22*c* contain, for example, tungsten.

The memory pillar MPa has a structure in which a plurality of pillars each extending in the Z direction are coupled to each other. In this example, the memory pillar MPa has a structure in which three sub memory pillars SMP1 through SMP3 are coupled in the Z direction. The sub memory pillars SMP1 through SMP3 are associated with tiers TI1 through TI3, respectively. The first tier TI1, the second tier TI2, and the third tier TI3 correspond to a unit of division performed in a step of forming holes for forming sub memory pillars SMP. Hereinafter, the holes for forming sub memory pillars SMP1 through SMP3 will be referred to as "memory holes MH1 through MH3", respectively. In the present example, the first tier TI1 includes eight layers of the conductive layer 22*a*. The second tier TI2 includes eight layers of the conductive layers 22*b*. The third tier TI3 includes eight layers of the conductive layers 22*c*.

The sub memory pillar SMP1 is provided, penetrating the insulating layers 30 and 31*a* and the conductive layers 21 and 22*a*. In other words, the sub memory pillar SMP1 has a part provided so as to face the select gate line SGS and the word lines WL0 through WL7 with respect to the Y direction. The sub memory pillar SMP2 is provided on the sub memory pillar SMP1. The part that couples the sub memory pillars SMP1 and SMP2 is included in a layer at a level at which the insulating layer 70*a* is provided. The sub memory pillar SMP2 is provided, penetrating the insulating layers 31*b* and the conductive layers 22*b*. In other words, the sub memory pillar SMP2 has a part provided so as to face the word lines WL8 through WL15 with respect to the Y direction. The sub memory pillar SMP3 is provided on the sub memory pillar SMP2. The part that couples the sub memory pillars SMP2 and SMP3 is included in a layer of a height at which the insulating layer 70*b* is provided. The sub memory pillar SMP3 is provided, penetrating the insulating layers 31*c* and 32 and the conductive layers 22*c* and 23. In other words, the sub memory pillar SMP3 has a part provided so as to face the word lines WL16 through WL23 and the select gate line SGD with respect to the Y direction.

The sub memory pillars SMP1 through SMP3 share the core member 40, the semiconductor layer 41, and the stacked film 42. In other words, the core member 40, the semiconductor layer 41, and the stacked film 42 included in the memory pillar MPa are continuously provided between the sub memory pillars SMP1 through SMP3. In this example, each of the sub memory pillars SMP1 through SMP3 has an inversely tapered shape. In other words, the XY sectional area of the upper end of the sub memory pillar SMP1 is larger than the XY sectional area of the lower end of the sub memory pillar SMP2. The XY sectional area of the upper end of the sub memory pillar SMP2 is larger than the XY sectional area of the lower end of the sub memory pillar SMP3. In the present specification, the "XY section" corresponds to a sectional area of a section parallel to the semiconductor substrate 20.

A part where the sub memory pillar SMP1 and the conductive layer 21 intersect each other functions as the select transistor ST2. Respective parts where the sub memory pillar SMP1 intersects with eight conductive layers 22*a* function as the memory cell transistors MT0 through MT7, in the order from the lowermost layer. Respective parts where the sub memory pillar SMP2 intersects with eight conductive layers 22*b* function as the memory cell transistors MT8 through MT15, in the order from the lowermost layer. Respective parts where the sub memory pillar SMP3 intersects with eight conductive layers 22*c* function as the memory cell transistors MT16 through MT23, in the order from the lowermost layer. A part where the sub memory pillar SMP3 and the conductive layer 23 intersect each other functions as the select transistor ST1.

The slit SLT of the third embodiment divides the conductive layers 21, 22*a*, 22*b*, 22*c*, and 23, and the insulating layers 30, 31*a*, 70*a*, 31*b*, 70*b*, 31*c*, and 32. In other words, the slit SLT divides each interconnect provided in the first tier TI1, the second tier TI2, and the third tier TI3, respectively. In the slit SLT, the contact LI is provided along the slit SLT. The upper end of the contact LI is provided at a level higher than the upper end of the memory pillar MPa and lower than the conductive layer 24. The lower end of the contact LI is in contact with the semiconductor substrate 20. The spacer SP distances and insulates between the contact LI and the conductive layers 21, 22*a*, 22*b*, 22*c*, and 23.

The dummy pillars DP1 through DP3 are provided so as to extend along the Z direction. The dummy pillars DP1 to DP3 are associated with the first tier TI1, the second tier TI2, and the third tier TI3, respectively. Specifically, the dummy pillar DP1 is in contact with some of the conductive layers 22*a* and the slit SLT. The dummy pillar DP2 is in contact with some of the conductive layers 22*b* and the slit SLT. The dummy pillar DP3 is in contact with the conductive layer 23, some of the conductive layers 22*c*, and the slit SLT. It is preferable that each dummy pillar DP does not reach the tier TI neighboring the tier TI to which this dummy pillar DP belongs. Each of the dummy pillars DP1 to DP3 includes, for example, an insulating layer 50. Each insulating layer 50 is provided so as to extend in the Z direction and to be in contact with the conductive layers 22 (or 22 and 23), through which the insulating layer 50 penetrates, and the side surface of the slit SLT.

Specifically, in the present example, the upper end part of the dummy pillar DP1 is in contact with an insulating layer 70*a*. The side part of the dummy pillar DP1 has a part facing each of the word lines WL2 through WL7 with respect to the Y direction. The bottom of the dummy pillar DP1 is in contact with the insulating layer 31*a* between the word lines WL1 and WL2. The upper end part of the dummy pillar DP2 is in contact with the insulating layer 70*b*. The side part of the dummy pillar DP2 has a part facing each of the word lines WL11 through WL15 with respect to the Y direction. The bottom of the dummy pillar DP2 is in contact with the word line WL10. The upper end part of the dummy pillar DP3 is in contact with the insulating layer 33. The side part of the dummy pillar DP3 has a part facing the select gate line SGD and each of the word lines WL18 through WL23 with respect to the Y direction. The bottom of the dummy pillar DP3 is in contact with the word line WL17. In the memory device 1 of the third embodiment, it suffices that the bottom of each dummy pillar DP1 does not reach the semiconductor substrate 20.

In the memory device 1 according to the third embodiment, in the area between the slit SLT and the memory pillars MP adjacent to the slit SLT, at least one conductive layer 22 of the tier TI neighboring above the tier TI that includes the dummy pillar DP has a tapered part TP. The tapered part TP of the conductive layer 22 is provided in a shape in which a distance to the semiconductor substrate 20 in the Z direction becomes shorter as the part approaches the slit SLT. In the present example, the conductive layers 22*b* of the second tier TI2 and the conductive layers 22*c* of the third tier TI3 have a tapered part TP in the area between the slit SLT and the memory pillars MP adjacent to the slit SLT.

In other words, the insulating layers 70*a* and 70*b* have a third part intersecting with the memory pillars MP, a fourth part intersecting with the dummy pillars DP, and a tapered part TP between the third part and the fourth part. The fourth part of the insulating layer 70*a* is thinner in thickness than the third part of the insulating layer 70*a*, and the plurality of word lines WL8 through WL15 have a part provided along the tapered part TP of the insulating layer 70*a*. Similarly, the fourth part of the insulating layer 70*b* is thinner in thickness than the third part of the insulating layer 70*b*, and the word lines WL16 through WL23 have a part provided along the tapered part TP of the insulating layer 70*b*.

FIG. 21 illustrates an example where the XY sectional area of the upper end of the sub memory pillar SMP1 is greater than the XY sectional area of the lower end of the sub memory pillar SMP2, and the XY sectional area of the upper end of the sub memory pillar SMP2 is greater than the XY sectional area of the lower end of the sub memory pillar SMP3; however, the shape of the memory pillar MPa is not limited to this example. In other words, of two adjacent sub memory pillars SMP, the XY section area of the upper end of the lower sub memory pillar SMP is not necessarily greater than the XY sectional area of the lower end of the upper sub memory pillar SMP.

Figure 22:
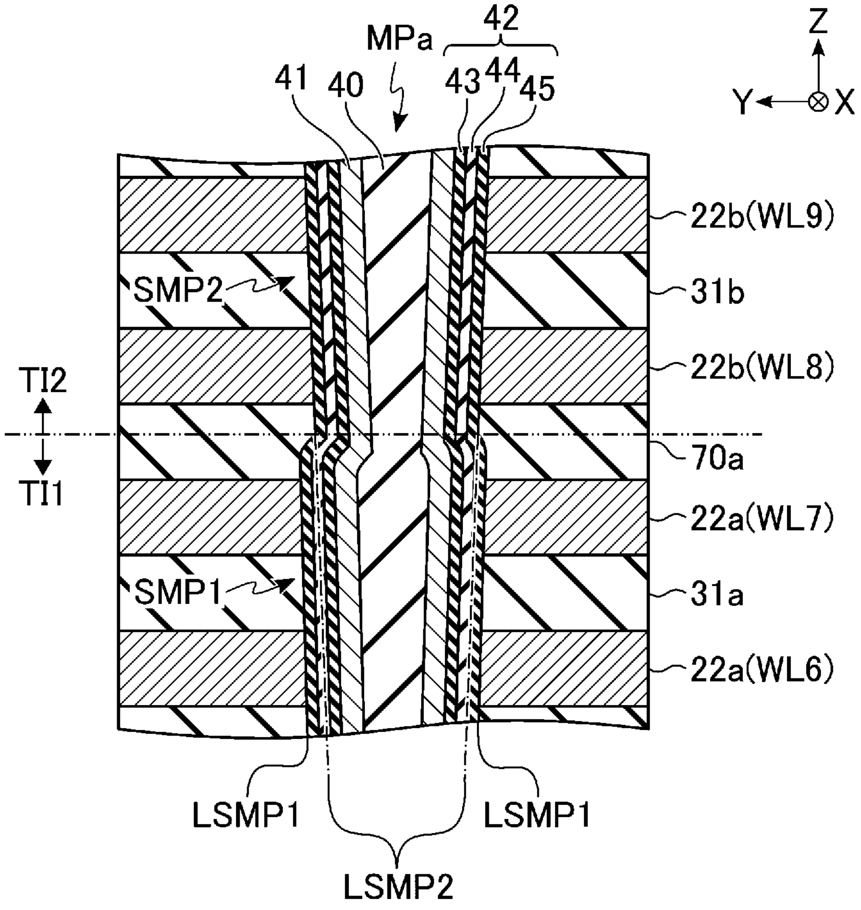
FIG. 22 is a sectional view of an example of a detailed sectional structure of a boundary part of a first tier and a second tier of a memory pillar included in the memory device according to the third embodiment.

FIG. 22 is a sectional view of an example of a detailed sectional structure of the boundary part of the first tier TI1 and the second tier TI2 of the memory pillar MPa included in the memory device 1 according to the third embodiment. As shown in FIG. 22, the upper end of the sub memory pillar SMP1 may have a round contour, not a square contour. In this case, it cannot be said that the XY sectional area of the upper end of the sub memory pillar SMP1 is clearly greater than the XY sectional area of the lower end of the sub memory pillar SMP2. However, the shape of the side surface of the memory pillar MPa is discontinuous in the boundary part of the sub memory pillars SMP1 and SMP2.

Specifically, in the YZ section, the side surface LSMP1 of the sub memory pillar SMP1 deviates from a continuation of the side surface LSMP2 of the sub memory pillar SMP2, which is indicated by an alternate long and short dashed line in FIG. 22. The deviation between two side surfaces LSMP1 and LSMP2 may occur in any section including the Z direction, such as an XZ section. The structure shown in FIG. 22 may be applied to the boundary part of the sub memory pillars SMP2 and SMP3. In other words, the structure shown in FIG. 22 may be formed in the boundary part of two adjacent sub memory pillars SMP in the memory pillar MP formed by coupling two or more sub memory pillars SMP. In the present description, the boundary part of two sub memory pillars SMP adjacent in the Z direction may be specified based on a discontinuous part in the shape of the side surface of the memory pillar MP.

The other configurations of the memory device 1 of the third embodiment are similar to those of the first embodiment. The dummy pillars DP in the memory device 1 according to the third embodiment may be replaced with the dummy pillars DPa of the second embodiment.

In the above-described memory device 1 according to the third embodiment, the memory pillars MP each include a first part (sub memory pillar SMP1) and a second part (sub memory pillar SMP2) above the first part. In each of the plurality of memory pillars MP, a side surface of the first part and a side surface of the second part are not continuous in the boundary part of the first part and the second part. The plurality of the word lines WL include a plurality of first word lines intersecting with the first part of the memory pillar MP and a plurality of second word lines intersecting with the second part of the memory pillar MP. In the third embodiment, the memory cell array 10 includes the dummy pillars DP1 and the dummy pillars DP2 spaced apart with respect to the Z direction. The dummy pillar DP1 faces at least one first word line included in a plurality of first word lines. The dummy pillar DP2 faces at least one second word line included in a plurality of second word lines. The height of the upper end of the dummy pillar DP1 is lower than the height of the upper end of the first part of the memory pillar MP. The insulating layer 70*a* provided between the first word lines and the second word lines has a third part intersecting with each of the memory pillars MP, and a fourth part in contact with the slit SLT. The level of the upper surface of the fourth part of the insulating layer 70*a* is lower than the level of the upper surface of the third part of the insulating layer 70*a*. The second word lines have parts provided along the tapered part TP, which is a part between the third part and the fourth part of the insulating layer 70*a*.

<3-2> Manufacturing Method

Figure 23:
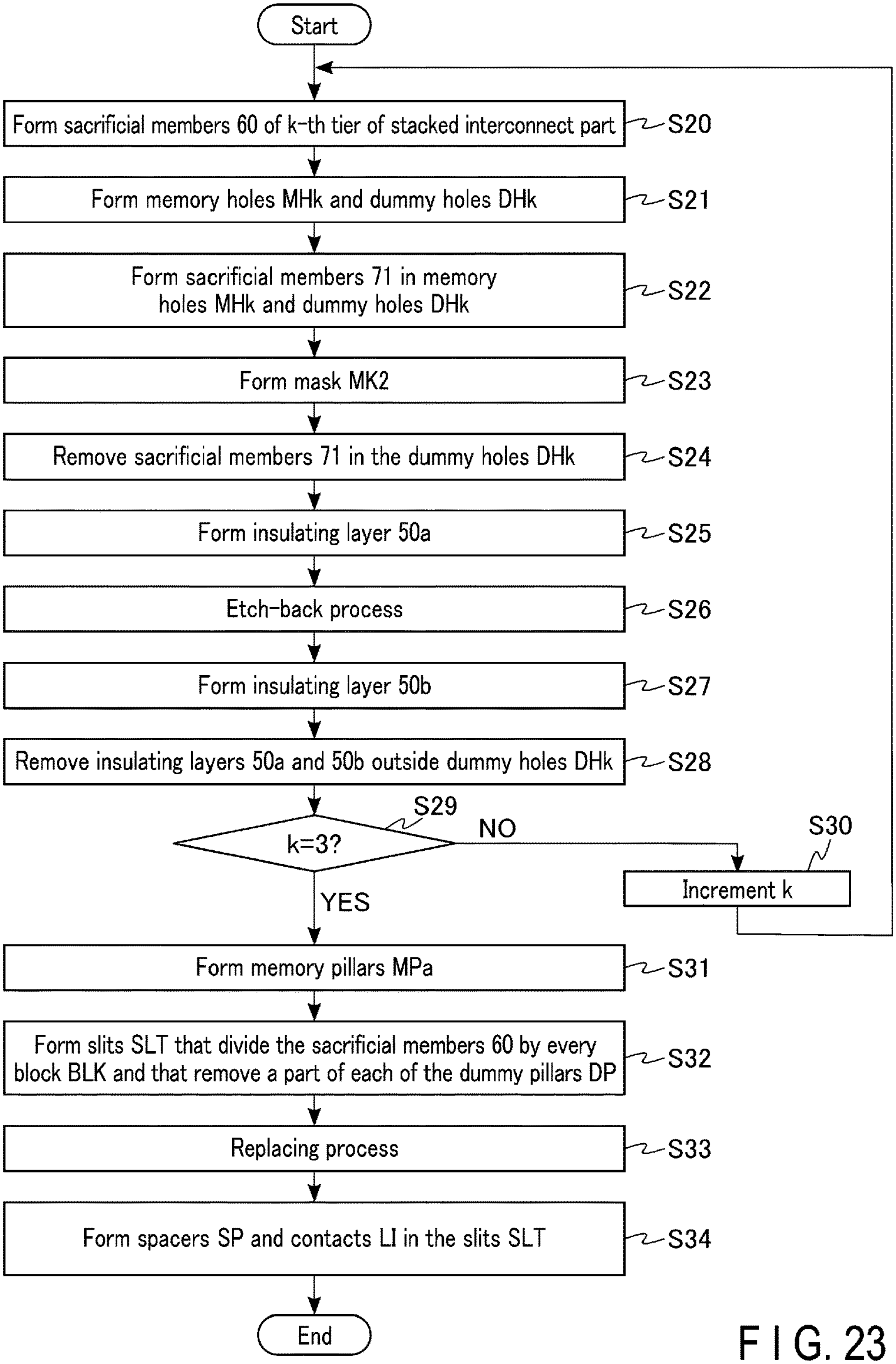
FIG. 23 is a flowchart showing an example of the manufacturing method of the memory cell array included in the memory device according to the third embodiment.

Next, a manufacturing method of the memory device 1 according to the third embodiment is described with reference to FIG. 23 as needed. FIG. 23 is a flowchart showing an example of the manufacturing method of the memory cell array 10 included in the memory device 1 according to the third embodiment, and shows a part of the manufacturing process for forming stacked interconnects. Each of FIGS. 24 to 35 which will be referred to in this section shows an example of a sectional structure of the memory device 1 according to the third embodiment in the course of manufacturing. The sectional structure that will be referred to in this section schematically shows an area in which a pair of memory pillars MP and a pair of dummy pillars DP, with a single slit SLT being interposed therebetween with respect to the Y direction, are formed or slated to be formed. In the explanation of FIG. 23, a variable "k" is used. "k" is a value indicating a tier associated with an in-progress manufacturing step. When the process shown in FIG. 23 starts, k=1.

First, the sacrificial member 60 of the k-th tier of the stacked interconnect part is formed (step S20). In other words, in the process of the first time step S20 is performed, the sacrificial member 60 of the first tier TI1 is formed. Specifically, the sacrificial members 60 and the insulating layers 31*a* are alternately stacked on the insulating layer 30. Then, the insulating layer 70*a* is formed on the uppermost sacrificial member 60.

Figure 24:
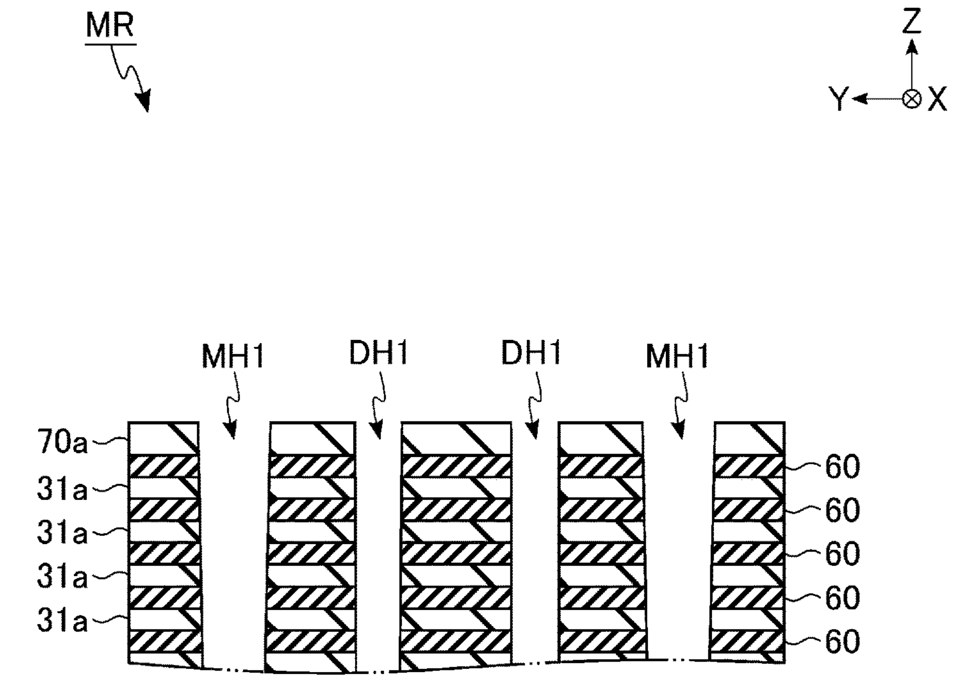
FIGS. 24 to 35 are sectional views showing an example of a sectional structure midway through the manufacturing of the memory device according to the third embodiment.

Next, memory holes MHk and dummy holes DHk are formed (step S21). In other words, in the first time step S21 is performed, the memory holes MH1 and the dummy holes DH1 of the first tier TI1 are formed, as shown in FIG. 24. The method of forming the memory holes MHk and the dummy holes DHk is the same as the process of step S12 in the first embodiment.

Next, a sacrificial member 71 is formed in the memory holes MHk and the dummy holes DHk (step S22). In other words, in the process of the first time step S22 is performed, the sacrificial member 71 is formed in the memory holes MH1 and the dummy holes DH1 of the first tier TI1.

Figure 25:
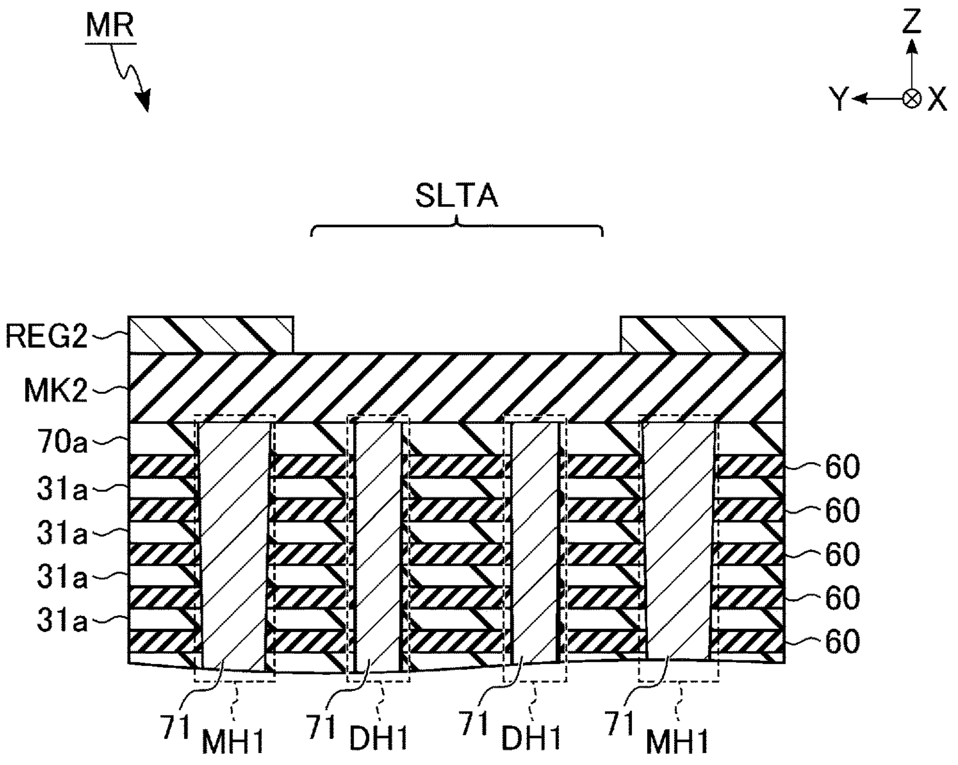
Figure 26:
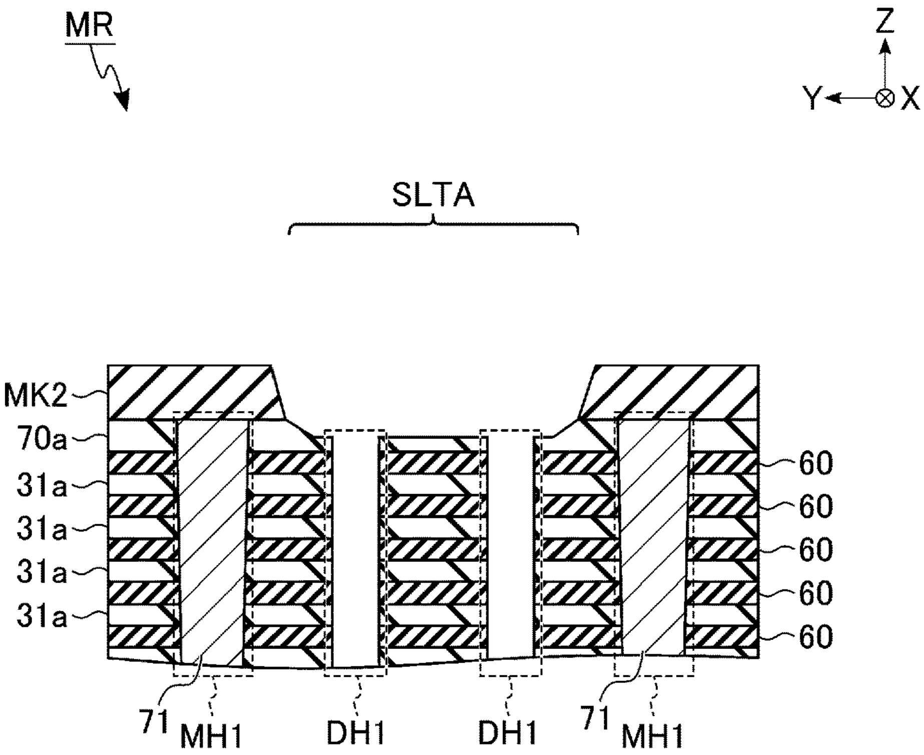

Next, a mask MK2 is formed (step S23). Specifically, in the first time step S23 is performed, a mask member (e.g., carbon), which is used as a mask for deep-hole etching, is formed on the insulating layer 70*a*. Then, a resist material REG2 is applied to the upper surface of the mask member. Then, the resist material REG2 is processed, by photolithography, into a shape covering above the memory holes MH1 and having an opening above the dummy holes DH1, as shown in FIG. 25. The opening of the resist material REG2 has a part extending along the slit area SLTA, for example. Thereafter, the mask member is processed by anisotropic etching using the resist material REG2 as a mask. As a result, as shown in FIG. 26, the mask MK2 that is processed based on a shape of the opening of the resist material REG2 is thereby formed in such a manner that the upper parts of the dummy holes DH1 are exposed. At this time, the part of the insulating layer 70*a* exposed at the openings of the mask MK2 may be removed to the extent that the upper surface of the uppermost layer of the sacrificial member 60 is not exposed. The insulating layer 70*a* may be in a tapered shape in the partially removed part.

Next, the sacrificial member 71 in the dummy holes DHk is removed (step S24). In the process of the first time step S24 is performed, the sacrificial member 71 in the dummy holes DH1 is removed. In the process of step S24, wet etching is performed, for example, and the sacrificial member 71 in the dummy holes DHk is selectively removed through the opening of the mask MK2.

Figure 27:
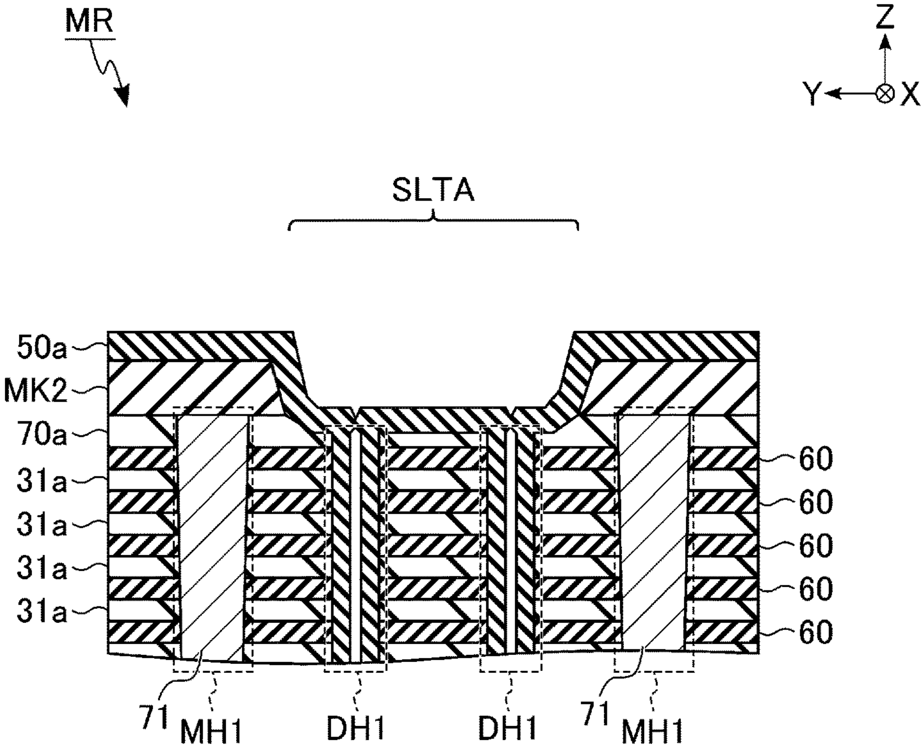

Next, the insulating layer 50*a* is formed (step S25). In the process of the first time step S25 is performed, the insulating layer 50*a* is formed along the dummy holes DH1, and the upper parts of the dummy holes DH1 are blocked by the insulating layer 50*a*, as shown in FIG. 27. In other words, space may be formed inside the dummy holes DH1 as a result of this process.

Figure 28:
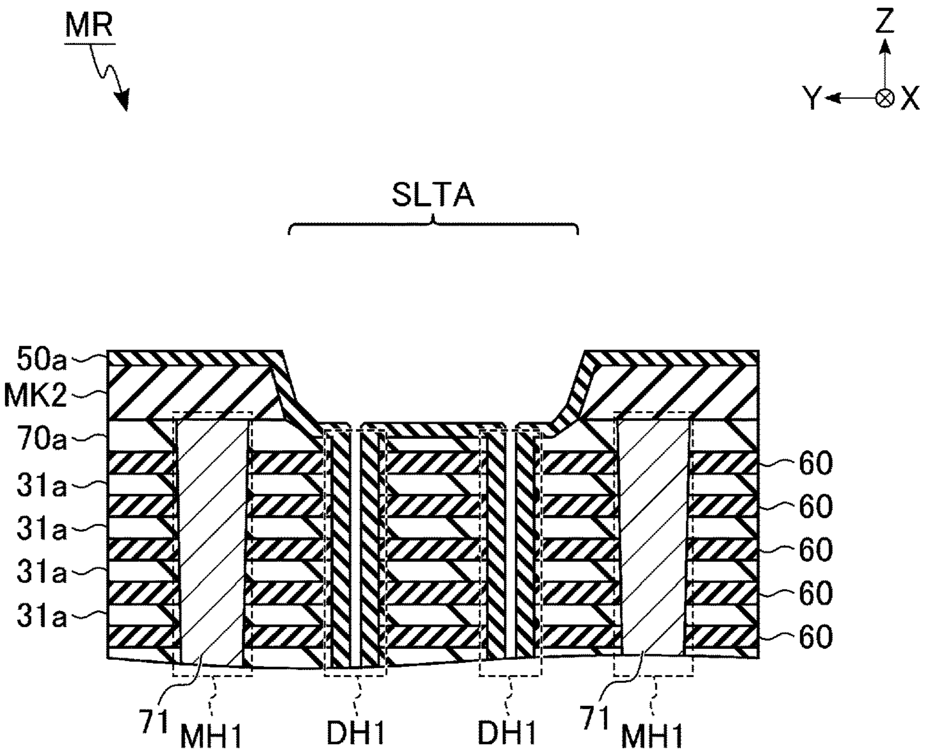

Next, the etch-back process is performed on the insulating layer 50*a* (step S26). In the first time step S26 is performed, the insulating layer 50*a* in the upper parts of the dummy holes DH1 is removed, and the space formed in the dummy holes DH1 is released, as shown in FIG. 28.

Figure 29:
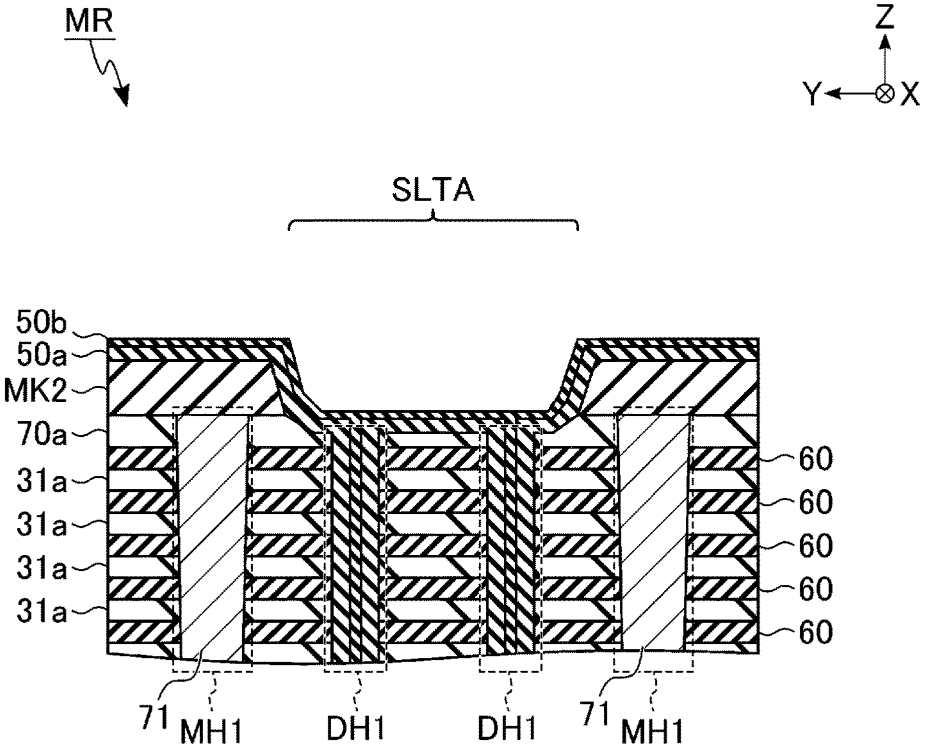

Next, an insulating layer 50*b* is formed (step S27). In the first time step S27 is performed, the insulating layer 50*b* is formed in the dummy holes DH1, and the dummy holes DH1 are filled by the insulating layers 50*a* and 50*b*, as shown in FIG. 29.

Figure 30:
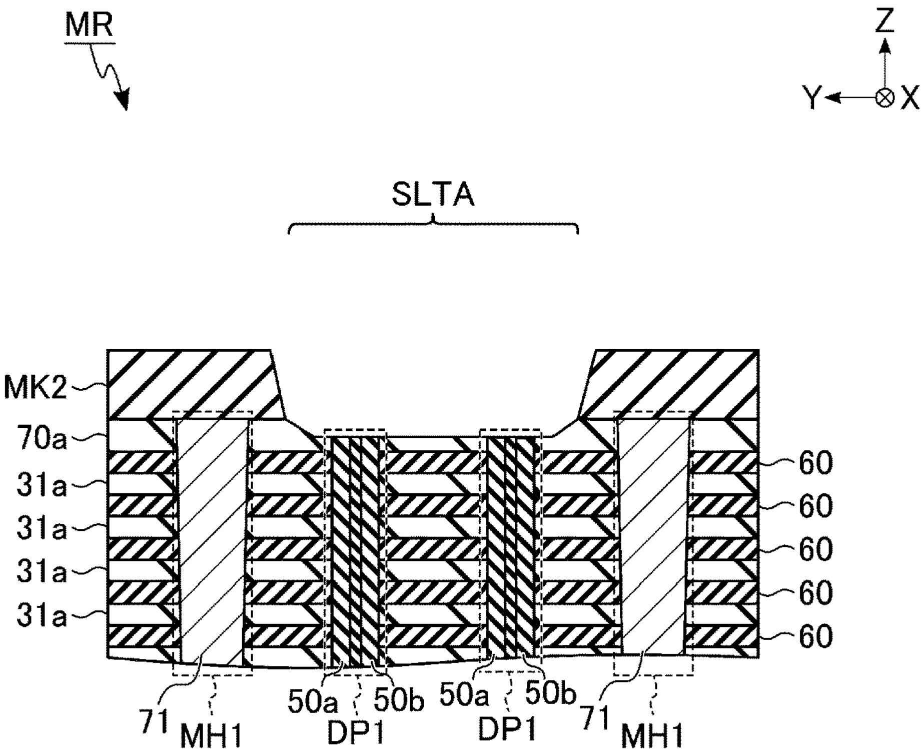
Figure 31:
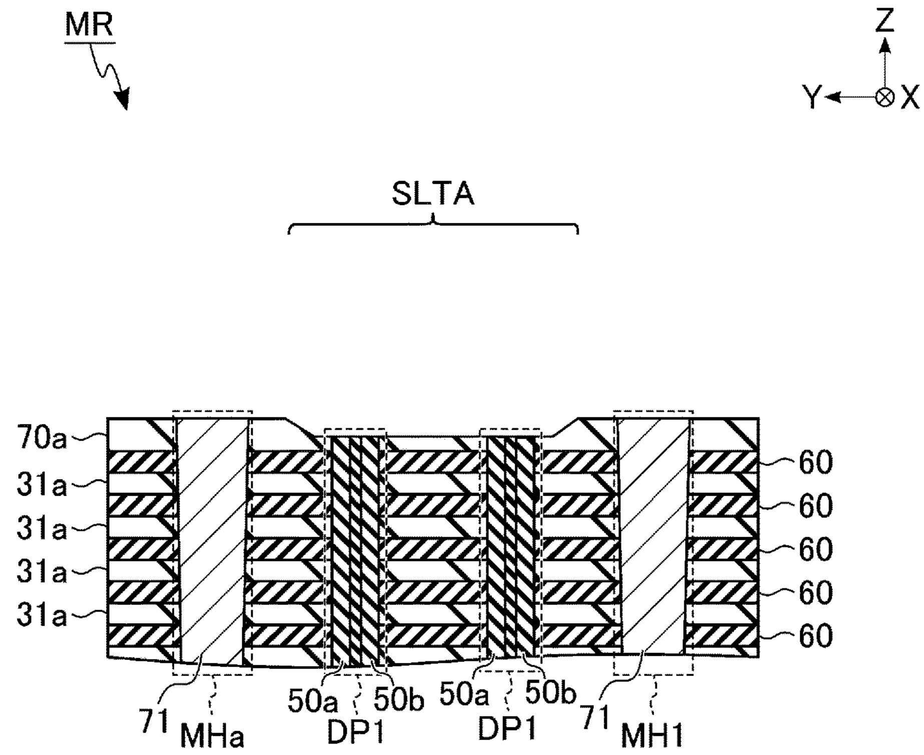

Next, the insulating layers 50*a* and 50*b* outside of the dummy holes DHk are removed (step S28). In the first time step S28 is performed, the insulating layers 50*a* and 50*b* outside the dummy holes DH1 are removed, and a structure in which the insulating layers 50*a* and 50*b* remain in the dummy holes DH1 is formed, as shown in FIG. 30. In other words, a structure corresponding to the dummy pillar DP1 is formed in the first time step S28 is performed. Thereafter, the mask MK2 is removed as shown in FIG. 31.

The process of step S29 is performed after step S28. In the process of step S29, the next process is determined based on whether or not the process of steps S20 through S28 is performed in all tiers TI. In the present example, it is determined whether or not k=3 holds in step S29 (step S29). This number "3" corresponds to the number of tiers of the memory pillars MPa in the present example. The number "3" used in the determination in step S29 may be changed in accordance with the number of tiers of the memory pillars MPa.

Figure 32:
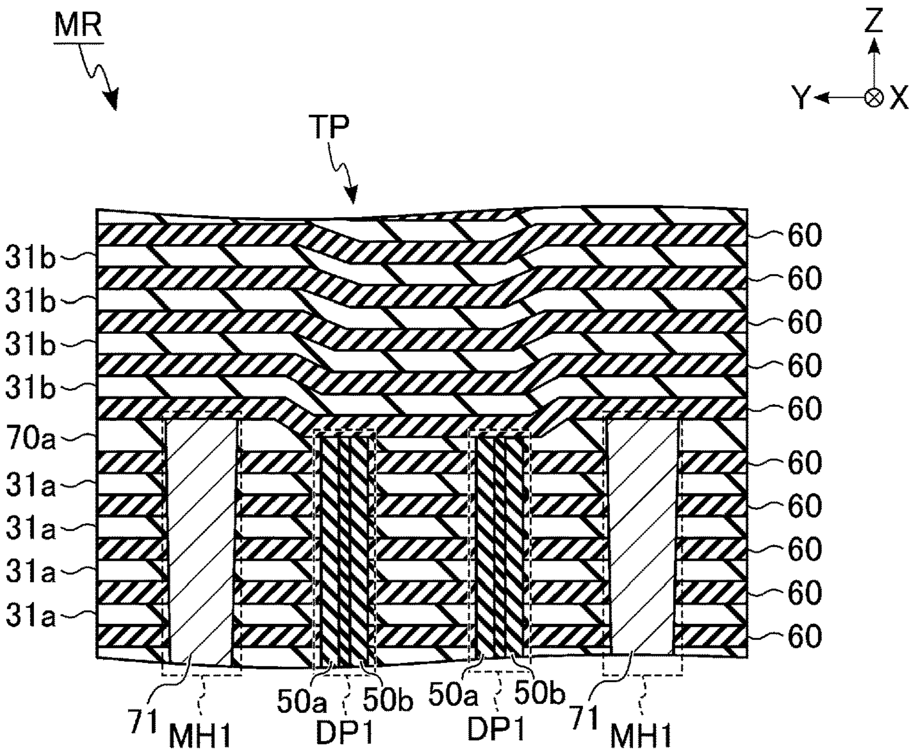

If it is determined that k=3 does not hold in step S29 (No in step S29), k is incremented (step S30). Then, the process of each of steps S20 through S28 is performed after step S30. In other words, if k=3 does not hold at the timing of step S29, the process of steps S20 through S28 targeting the next tier is performed. For example, in the second time step S20 is performed, the sacrificial members 60 and the insulating layers 31*b* are alternately stacked, as shown in FIG. 32. At this time, in the stacked sacrificial members 60 and the insulating layer 31*b*, tapered parts TP are formed along the shape of the insulating layer 70*a*. Then, by repeating the process of steps S20 through S28, a structure in which the memory holes MH1 through MH3 are coupled in the Z direction is formed and the dummy pillars DP1 through DP3 are formed.

Figure 33:
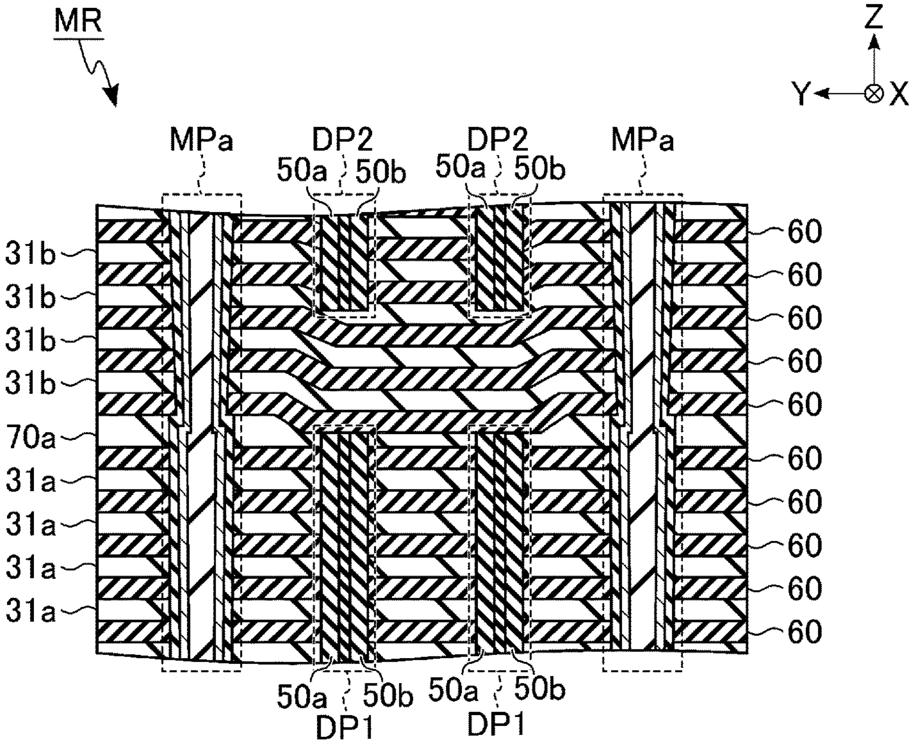

If k=3 in the process of step S29 (Yes in step S29), the memory pillars MPa are formed (step S31). Specifically, the sacrificial members 71 formed in the memory holes MH1 through MH3 are first removed, so that space connecting the memory holes MH1 through MH3 is formed. Next, the stacked film 42 (namely, a block insulating film 45, an insulating film 44, and a tunnel insulating film 43), the semiconductor layer 41, and the core member 40 are formed in this order on the side surfaces and the bottom surfaces of the set of the memory holes MH1 through MH3. Thereafter, a part of the core member 40 provided at an upper part of the set of the memory holes MH1 through MH3 is removed, and the semiconductor layer 41 is formed in the part from which the core member 40 is removed. As a result, a structure corresponding to the memory pillar MPa is formed in the set of the memory holes MH1 through MH3, as shown in FIG. 33.

Figure 34:
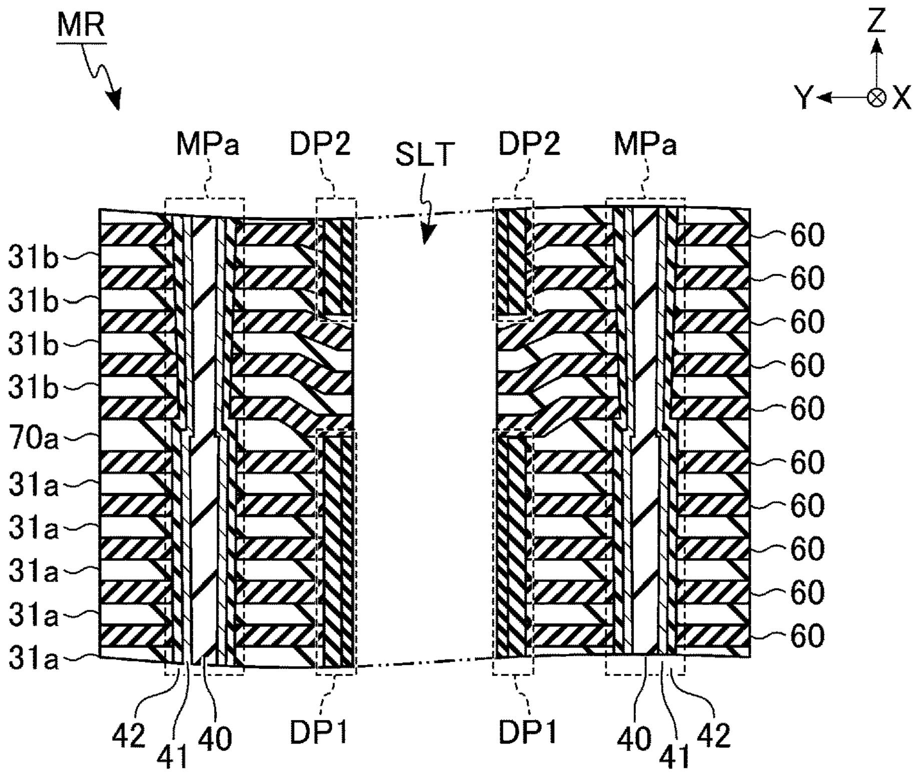

Next, slits SLT that divide the sacrificial members 60 by every block BLK and that remove a part of each of the dummy pillars DP are formed (step S32). Specifically, a slit SLT is formed in such a manner that a part of each of the dummy pillars DP1 through DP3 are removed when viewed in a plan-view perspective by a combination of photolithography and anisotropic etching. The slit SLT divides the insulating layers 30 to 32, 70*a*, and 70*b*, and the sacrificial members 60, as shown in FIG. 34. By this processing, the surface of the semiconductor substrate 20 is exposed in the bottom of the slit SLT.

Next, a replacing process is performed (step S33). Specifically, the sacrificial members 60 are selectively removed via the slit SLT by wet etching using hot phosphoric acid or the like. Thereafter, a conductor is embedded in the space from which the sacrificial members 60 have been removed, via the slit SLT. To form the conductor in this step, CVD is used for example. After that, the conductor formed inside the slit SLT is removed by an etch-back process, and the conductor formed in adjacent spaces is separated into multiple layers. Accordingly, a conductive layer 21 functioning as a selection gate line SGS, conductive layers 22*a*, 22*b*, and 22*c* each functioning as a word line WL, and a conductive layer 23 functioning as a selection gate line SGD are formed.

Figure 35:
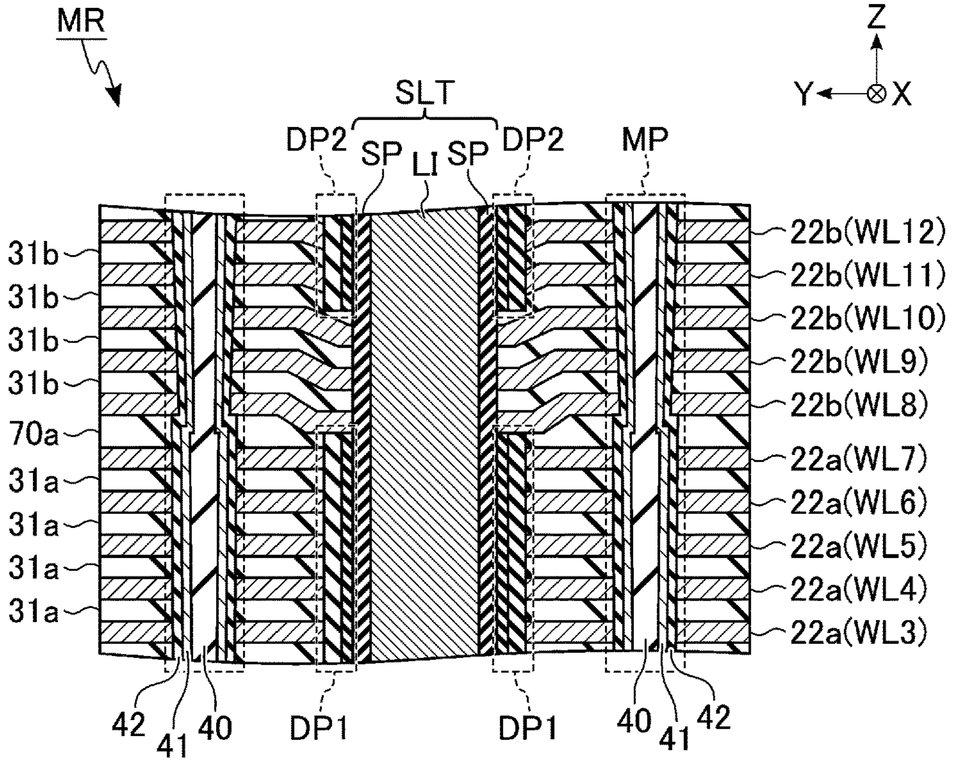

Next, spacers SP and contacts are formed in the slits SLT (step S34). Specifically, insulating films slated to be used as the spacers SP are first formed. Then, the insulating film formed in the bottom of the slit SLT is removed by an etch-back process. Thereafter, a conductor is formed so as to fill the slit SLT, and the conductor outside the slit SLT is removed. Thus, a structure in which the spacers SP and the contact LI remain in the slit SLT is formed as shown in FIG. 35. After the process in step S34 is finished, the series of processes shown in FIG. 23 is finished (End).

<3-3> Effects of Third Embodiment

In the memory device 1 of the third embodiment, provision of a dummy pillar DP in each tier TI suppresses a projection of a mask member provided in the slit area SLTA in each of the first tier TI1, the second tier TI2, and the third tier TI3 toward respective memory holes MH1 through MH3 arranged in the end row at the time of processing memory holes MH in each tier TI. Furthermore, in the third embodiment, a stacked interconnect part having tapered parts TP is formed between the slit SLT and the memory hole MH arranged in the end row. In the tier TI having the tapered parts TP in the stacked interconnect part, a projection of a mask member at the time of processing the memory holes MH can be further suppressed. As a result, the memory device 1 according to the third embodiment can improve yield and operation characteristics of the memory device 1.

<4> Modifications

The above-described memory device 1 can be modified in various manners.

Figure 36:
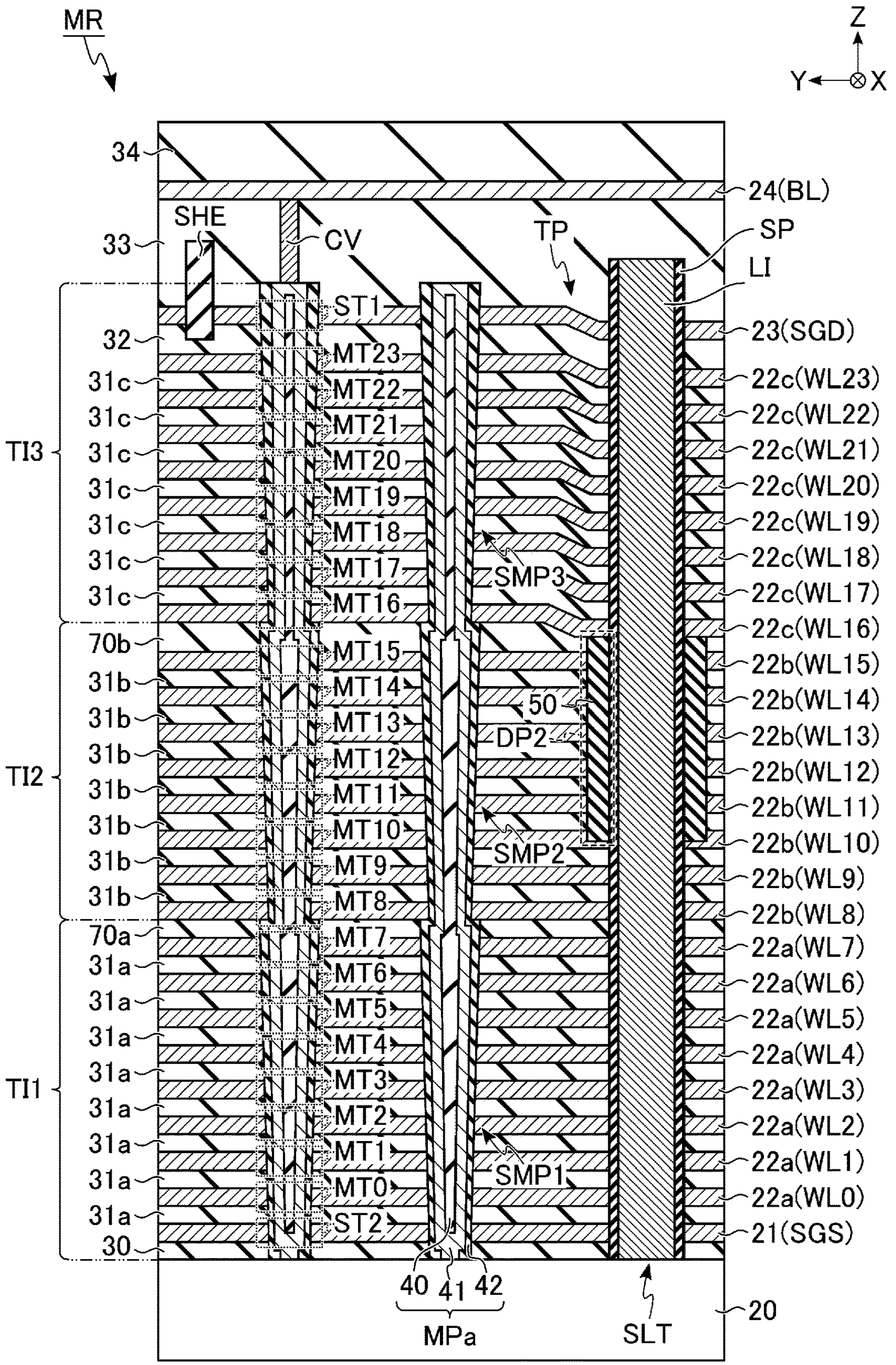
FIG. 36 is a sectional view showing an example of a sectional structure of a memory cell array according to a first modification.

A modification of the structure of the dummy pillars DP in the memory device 1 of the third embodiment is described as a first modification hereinafter. FIG. 36 is a sectional view showing an example of a sectional structure of a memory cell array 10 according to the first modification. FIG. 36 shows an area similar to the memory cell array 10 described in the third embodiment with reference to FIG. 21. As shown in FIG. 36, the memory cell array 10 of the first modification has a structure similar to that of the memory cell array 10 of the third embodiment with an omission of the dummy pillars DP1 and DP3. Thus, if the memory cell array 10 has multiple tiers TI, it may have a tier TI in which no dummy pillars DP are arranged. Such a tier TI in which no dummy pillars DP are arranged is not limited to the first tier TI1 or the third tier TI3 but may be any of the first tier TI1, the second tier TI2, or the third tier TI3. It suffices that the memory device 1 of the third embodiment has a dummy pillar DP having the bottom in at least one tier TI, the bottom being at a level differing from a bottom level of a sub memory pillar SMP provided in the same tier TI. Even such a modification can achieve the same advantageous effects as those of the third embodiment. For example, in the first modification, a plurality of first word lines are included in the first tier TI1, and a plurality of second word lines are included in the second tier TI2. Furthermore, a plurality of dummy pillars DP are included in either one of the first tier TI1 or the second tier TI2.

Figure 37:
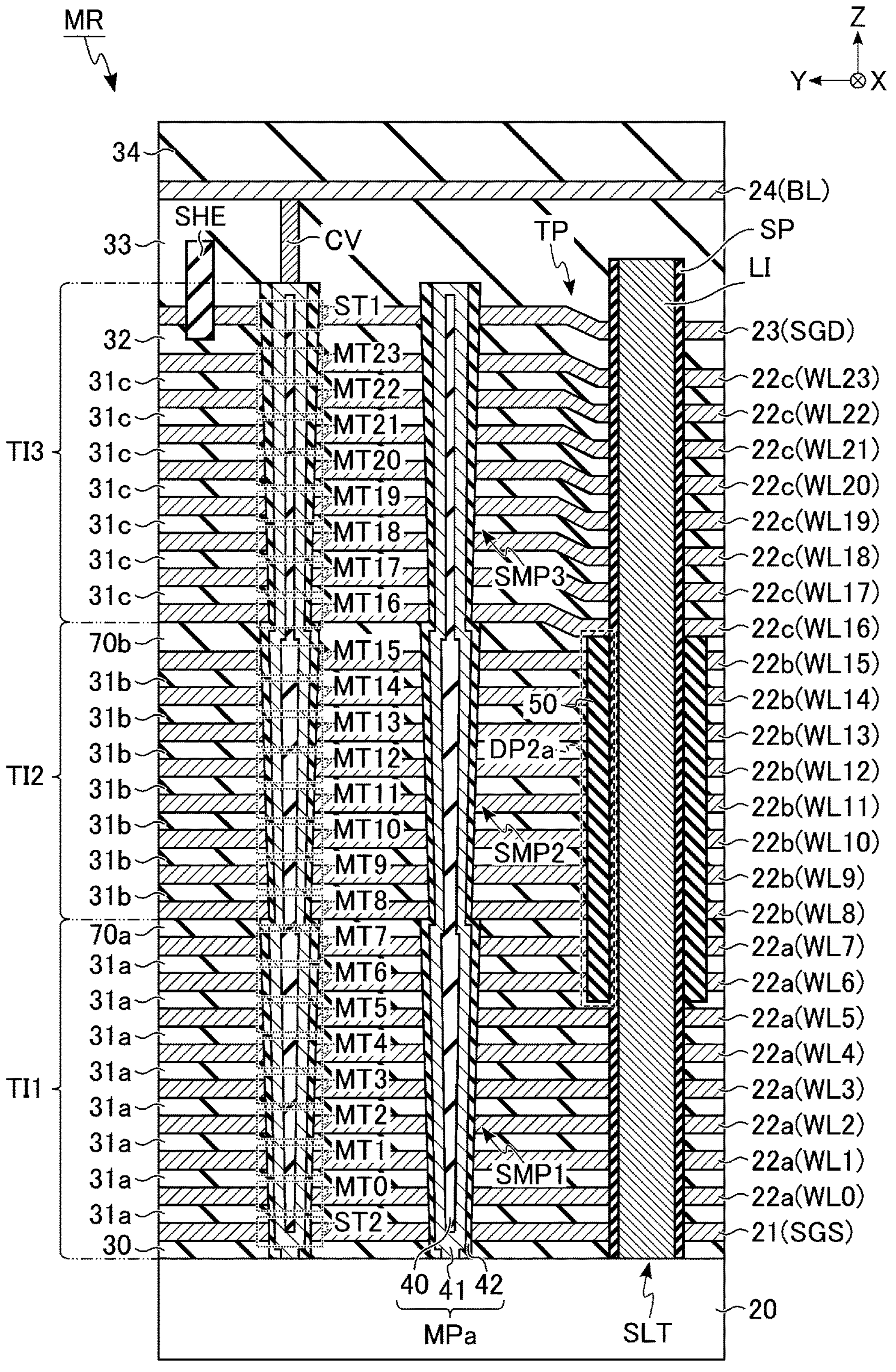
FIG. 37 is a sectional view showing an example of a sectional structure of a memory cell array according to a second modification.

Another modification of the structure of the dummy pillars DP in the memory device 1 of the third embodiment is described as a second modification hereinafter. FIG. 37 is a sectional view showing an example of a sectional structure of a memory cell array 10 according to the second modification. FIG. 37 shows an area similar to the memory cell array 10 described in the third embodiment with reference to FIG. 21. As shown in FIG. 37, the memory cell array 10 of the second modification has a structure in which the dummy pillars DP1 and DP3 are omitted in the memory cell array 10 of the third embodiment. Furthermore, the memory cell array 10 according to the second modification has a structure having the dummy pillars DP2*a* associated with the second tier TI2 whose bottoms reach the first tier TI1. Thus, if the dummy pillars DP are omitted in a tier TI, the bottoms of the dummy pillars DP associated with a tier TI (e.g., the second tier TI2) above the tier TI (e.g., the first tier TI1) in which the dummy pillars DP are omitted may reach the tier TI in which the dummy pillars DP are omitted. Even such a modification can achieve the same advantageous effects as those of the third embodiment.

Figure 38:
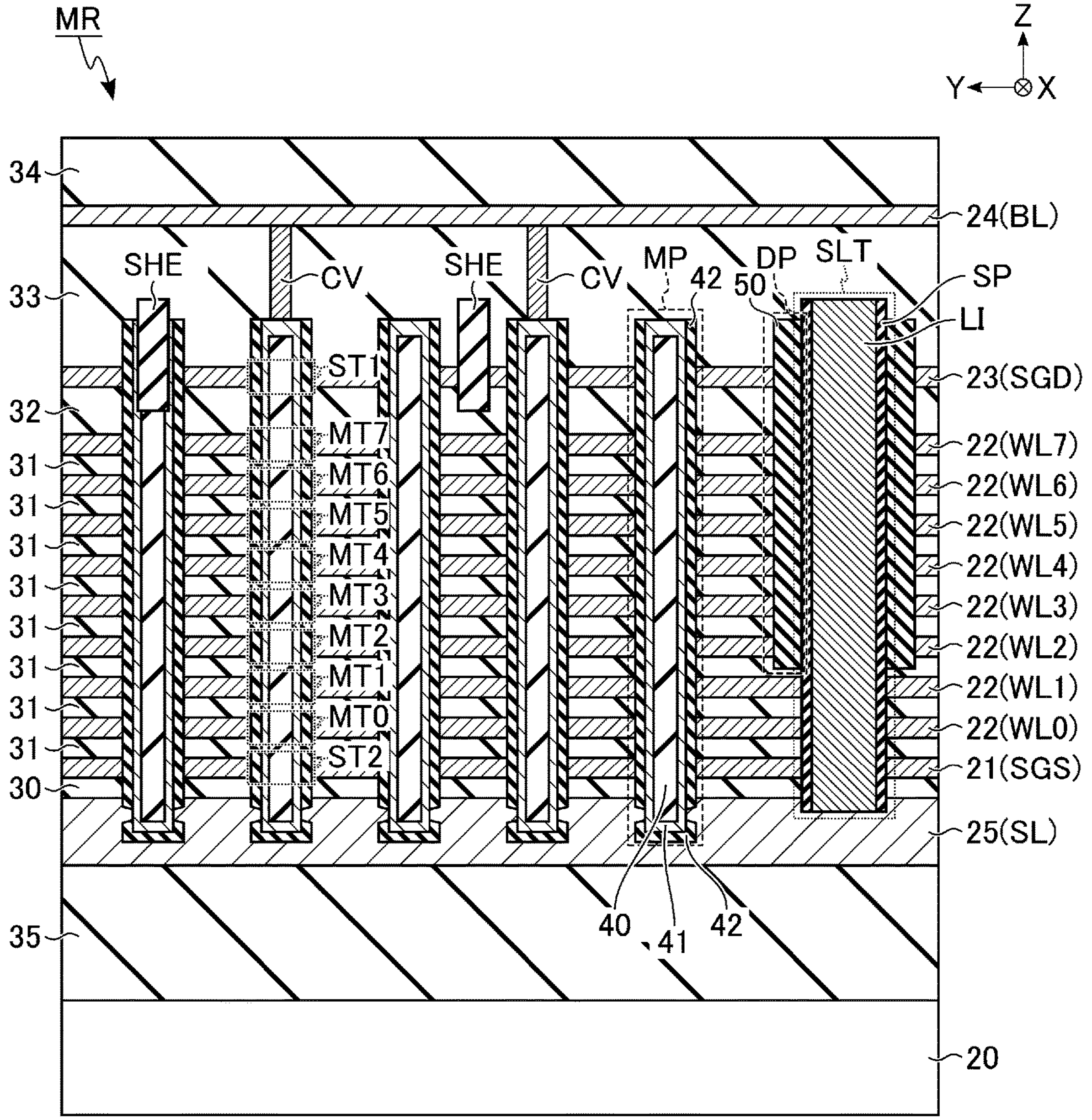
FIG. 38 is a sectional view showing an example of a sectional structure of a memory cell array according to a third modification.

A modification of the structure of the memory cell array 10 in the memory device 1 of the first embodiment is described as a third modification hereinafter. FIG. 38 is a sectional view showing an example of a sectional structure of the memory cell array 10 according to the third modification. FIG. 38 shows an area similar to the memory cell array 10 described in the first embodiment with reference to FIG. 5. As shown in FIG. 38, the memory cell array 10 of the third modification has a structure in which the conductive layer 25 and the insulating layer 35 are added to the memory cell array 10 of the first embodiment. The insulating layer 35 is provided on the semiconductor substrate 20. The conductive layer 25 is provided between the insulating layers 35 and 30. In the semiconductor substrate 20 of the third modification, a CMOS circuit is arranged in a part overlapping with the stacked interconnects with respect to the Z direction. Such a CMOS circuit includes, for example, a sense amplifier module 17. In the insulating layer 35, interconnects used for coupling the CMOS circuit are arranged. The conductive layer 25 is coupled to the semiconductor layer 41 via the side surface of the memory pillar MP, and is coupled to the contact LI in the slit SLT. The conductive layer 25 is thereby used as a part of the source line SL. Thus, the memory device 1 may have a structure in which the source line SL and the semiconductor layer 41 in the memory pillar MP are electrically coupled via the side surface of the memory pillar MP. In the memory device 1 of the third modification, each of the memory pillars MP includes the semiconductor layer 41 coupled to the source line SL, and the bottom of each of the dummy pillars DP is spaced apart from the source line SL.

In the foregoing embodiments, the circuit configuration, the planar layout, and the sectional structure of the memory device 1 may be changed as appropriate. For example, it suffices that at least one hookup region HR is provided. The memory pillar MP may have a structure in which a pillar corresponding to a select gate line SGD and a pillar corresponding to a word line WL are coupled. In this case, the dummy pillars DP of the first embodiment are provided, intersecting with at least one conductive layer 22, without intersecting with the conductive layer 23. The memory pillars MP and the bit lines BL may be electrically connected via a plurality of contacts coupled in the Z direction. A conductive layer may be inserted into a coupled portion of the contacts. The number of interconnect layers and contacts included in the memory device 1 may be changed as appropriate in accordance with a circuit design of the memory device 1. In the drawings used for explanation of the foregoing embodiments, the memory pillars MP are illustrated as having the same diameter in the Z direction; however, the embodiments are not limited to this illustration. The memory pillars MP may have a tapered shape, an inversely tapered shape, or a bowed shape. Similarly, the sub memory pillars SMP may have a tapered shape, an inversely tapered shape, or a bowed shape. The slits SLT and SHE may have a tapered shape, an inversely tapered shape, or a bowed shape. The XY sectional structure of the memory pillars MP and the XY sectional structure of the virtual circle of the dummy pillars DP may be a circle or an ellipsis. In the third embodiment, the memory cell transistors MT provided in the vicinity of the boundary part of two sub memory pillars SMP may not be used for storing data and may be used as a dummy transistor.

The manufacturing steps described in the above are merely examples. For example, other processes may be inserted between the manufacturing steps, and the order of the manufacturing steps may be shuffled to the degree that does not cause a problem. In the present description, each of the slits SLT and SHE may be called an "insulating member". The expression "coupled" means an electrical coupling, and does not exclude a coupling with an element being interposed in the coupling, for example. The expression "electrically coupled" may include a case where an insulator is involved as long as the coupling can operate as an electrical coupling. The expression "tapered shape" refers to a shape that gets narrower as it gets farther from a reference member. The expression "inversely tapered shape" refers to a shape that gets thicker as it gets farther from a reference member. The expression "columnar" means a structure provided in a hole formed in a manufacturing process of the memory device 1. The term "diameter" is an inner diameter of a hole or an outer diameter of a pillar in a section parallel to the surface of a substrate (XY section). The term "semiconductor substrate" may be called a "substrate". The term "semiconductor substrate" may be called a "conductive layer". The term "region" may be regarded as a structure included within a substrate. For example, when the semiconductor substrate 20 is defined as including a memory region MR and a hookup region HR, the memory region MR and the hookup region HR are associated with a region above the semiconductor substrate 20. The expression "height" corresponds an interval between a measurement target structure and the semiconductor substrate 20 in the Z direction, for example. As a reference for "height," a structure other than the semiconductor substrate 20 may be used. The expression "planar position" refers to a position of a constituent element in a planar layout. The expression "top view (plan view)" corresponds to a view of a top surface of the semiconductor substrate 20 in the vertical direction of the semiconductor substrate 20, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory device comprising:

a first plate-shaped member and a second plate-shaped member each having a part extending in a first direction, the first plate-shaped member and the second plate-shaped member being aligned in a second direction intersecting with the first direction;

a plurality of columnar members each having a part extending in a third direction intersecting with the first direction and the second direction, the plurality of columnar members being arranged in a matrix of K rows (K is an integer equal to or greater than 4) aligned in the second direction between the first plate-shaped member and the second plate-shaped member, the plurality of columnar members including a plurality of memory pillars and a plurality of dummy pillars, the plurality of memory pillars are arranged in multiple rows between a first row and a K-th row of the K rows, the plurality of dummy pillars are arranged in the first row and the K-th row of the K rows; and a plurality of word lines provided between the first plate-shaped member and the second plate-shaped member, spaced apart in the third direction, wherein each of the memory pillars includes a semiconductor layer having a part provided facing each of the word lines with respect to the second direction, each of the plurality of dummy pillars has a part provided facing at least one of the plurality of word lines with respect to the second direction and includes a first insulating layer provided in contact with one of the first plate-shaped member or the second plate-shaped member, a diameter of each of the plurality of dummy pillars is smaller than a diameter of each of the plurality of memory pillars at a position in the third direction where a word line, among the plurality of word lines, facing both the plurality of memory pillars and the plurality of dummy pillars with respect to the second direction is included.

2. The memory device of claim 1, wherein each of the plurality of dummy pillars has an approximately semicircular section that is chipped off by the one of the first plate-shaped member or the second plate-shaped member at the position in the third direction.

3. The memory device of claim 1, wherein a first interval, a second interval, and a third interval are approximately equal, the first interval is an interval in the second direction between a center of a dummy pillar arranged in the first row of the K rows and a center of a memory pillar arranged in a second row of the K rows, the second interval is an interval in the second direction between centers of two memory pillars arranged in two adjacent rows between the first row and the K-th row of the K rows, and the third interval is an interval in the second direction between a center of a dummy pillar arranged in the K-th row of the K rows and a center of a memory pillar arranged in a (K-1)th row of the K rows.

4. The memory device of claim 1, further comprising:

a source line provided apart from the plurality of word lines in the third direction, wherein the source line is coupled to the semiconductor layer of each of the plurality of memory pillars, and is spaced apart from each of the plurality of dummy pillars in the third direction.

5. The memory device of claim 4, wherein each of the first plate-shaped member and the second plate-shaped member is in contact with the source line.

6. The memory device of claim 1, wherein each of the plurality of memory pillars includes a first part and a second part on the first part, in each of the plurality of memory pillars, a side surface of the first part and a side surface of the second part are not continuous in a boundary part of the first part and the second part, and the plurality of word lines include a plurality of first word lines and a plurality of second word lines, the first word lines intersecting with the first part of each of the memory pillars, the second word lines intersecting with the second part of each of the memory pillars.

7. The memory device of claim 6, wherein each of the plurality of dummy pillars includes a first dummy pillar and a second dummy pillar, spaced apart in the third direction, the first dummy pillar has a part facing at least one of the plurality of first word lines with respect to the second direction, and the second dummy pillar has a part facing at least one of the plurality of second word lines with respect to the second direction.

8. The memory device of claim 6, wherein the plurality of first word lines are included in a first tier, and the plurality of second word lines are included in a second tier, and the plurality of dummy pillars are included in either one of the first tier or the second tier.

9. The memory device of claim 6, wherein each of the plurality of dummy pillars includes a first dummy pillar having a part facing at least one of the plurality of first word lines with respect to the second direction, and a height of an upper end of the first dummy pillar is lower than a height of an upper end of the first part of each of the memory pillars.

10. The memory device of claim 6, further comprising:

a second insulating layer provided between the plurality of first word lines and the plurality of second word lines, wherein the second insulating layer has a third part, a fourth part, and a tapered part between the third part and the fourth part, the third part intersecting with each of the memory pillars, and the fourth part intersecting with a dummy pillar whose first insulating layer is in contact with the one of the first plate-shaped member or the second plate-shaped member among the plurality of dummy pillars, the fourth part of the second insulating layer is thinner than the third part of the second insulating layer, and at least one of the second word lines has a part provided along the tapered part of the second insulating layer.

11. A memory device comprising:

a first plate-shaped member and a second plate-shaped member each having a part extending a first direction, the first plate-shaped member and the second plate-shaped member being aligned in a second direction intersecting with the first direction;

a plurality of columnar members each having a part extending in a third direction intersecting with the first direction and the second direction, the plurality of columnar members being arranged between the first plate-shaped member and the second plate-shaped member in a matrix of K rows (K is an integer equal to or greater than 4) aligned in the second direction, the plurality of columnar members including a plurality of memory pillars and a plurality of dummy pillars, the plurality of memory pillars are arranged in multiple rows between a first row and a K-th row of the K rows, the plurality of dummy pillars are arranged in the first row and the K-th row of the K rows;

a plurality of word lines provided between the first plate-shaped member and the second plate-shaped member, spaced apart in the third direction; and a conductive layer provided apart from the plurality of word lines in the third direction, wherein each of the plurality of memory pillars includes a semiconductor layer, the semiconductor layer having a part facing each of the word lines with respect to the second direction and a part coupled to the conductive layer, each of the plurality of dummy pillars includes a first insulating layer, the first insulating layer having a part facing at least one of the word lines with respect to the second direction, the first insulating layer being in contact with one of the first plate-shaped member or the second plate-shaped member, spaced apart from the conductive layer in the third direction.

12. The memory device of claim 11, wherein each of the plurality of dummy pillars has an approximately semicircular section that is chipped off by the one of the first plate-shaped member or the second plate-shaped member at a position in the third direction where a word line, among the plurality of word lines, facing both the memory pillars and the dummy pillars with respect to the second direction is included.

13. The memory device of claim 11, wherein each of a first interval and a second interval is wider than a third interval, the first interval is an interval in the second direction between a center of a dummy pillar arranged in the first row of the K rows and a center of a memory pillar arranged in a second row of the K rows, the second interval is an interval in the second direction between a center of a dummy pillar arranged in a K-th row of the K rows and a center of a memory pillar arranged in a (K-1)th row of the K rows, and the third interval is an interval in the second direction between centers of two memory pillars arranged in two adjacent rows between the first row and the K-th row of the K rows.

14. The memory device of claim 13, wherein a diameter of each of the dummy pillars is approximately the same as a diameter of each of the memory pillars at a position in the third direction where a word line, among a plurality of word lines, facing both the plurality of memory pillars and the plurality of dummy pillars with respect to the second direction is included.

15. The memory device of claim 11, wherein each of the plurality of memory pillars includes a first part and a second part on the first part, in each of the plurality of memory pillars, a side surface of the first part and a side surface of the second part are not continuous in a boundary part between the first part and the second part, and the plurality of word lines include a plurality first word lines and a plurality of second word lines, the first word lines intersecting with the first part of each of the memory pillars, the second word lines intersecting with the second part of each of the memory pillars.

16. The memory device of claim 15, wherein the plurality of dummy pillars include a first dummy pillar and a second dummy pillar, spaced apart in the third direction, and the first dummy pillar has a part provided facing at least one of the plurality of first word lines with respect to the second direction, and the second dummy pillar has a part provided facing at least one of the plurality of second word lines with respect to the second direction.

17. The memory device of claim 15, wherein the plurality of first word lines are included in a first tier, the plurality of second word lines are included in a second tier, and the plurality of dummy pillars are included in either one of the first tier or the second tier.

18. The memory device of claim 15, wherein each of the plurality of dummy pillars include a first dummy pillar facing at least one of the plurality of first word lines with respect to the second direction, and a height of an upper end of the first dummy pillar is lower than a height of an upper end of the first part of each of the memory pillars.

19. The memory device of claim 15, further comprising:

a second insulating layer provided between the plurality of first word lines and the plurality of second word lines, wherein the second insulating layer has a third part, a fourth part, and a tapered part between the third part and the fourth part, the third part intersects with each of the memory pillars, and the fourth part intersects with a dummy pillar whose first insulating layer is in contact with the one of the first plate-shaped member or the second plate-shaped member among the plurality of dummy pillars, the fourth part of the second insulating layer is thinner than the third part of the second insulating layer, and at least one of the second word lines has a part provided along the tapered part of the second insulating layer.

20. The memory device of claim 11, wherein each of the first plate-shaped member and the second plate-shaped member is in contact with the conductive layer.

* * * * *